(12) United States Patent
Wang et al.

(10) Patent No.: US 12,720,833 B2
(45) Date of Patent: Aug. 25, 2026

(54) FIELD PLATES FOR INTEGRATED CIRCUITS

(71) Applicant: TEXAS INSTRUMENTS INCORPORATED, Dallas, TX (US)

(72) Inventors: Fuchao Wang, Plano, TX (US); Billy Alan Wofford, Sunnyvale, TX (US); Ebenezer Eshun, Frisco, TX (US); Jungwoo Joh, Allen, TX (US); Dong Seup Lee, McKinney, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 735 days.

(21) Appl. No.: 18/193,391

(22) Filed: Mar. 30, 2023

(65) Prior Publication Data

US 2024/0332369 A1 Oct. 3, 2024

(51) Int. Cl.

| | |
|---|---|
| ***H01L 29/20*** | (2006.01) |
| ***H10D 62/13*** | (2025.01) |
| ***H10D 62/85*** | (2025.01) |
| ***H10D 64/00*** | (2025.01) |
| ***H10D 84/05*** | (2025.01) |
| ***H10D 84/83*** | (2025.01) |

(52) U.S. Cl.

CPC ....... *H10D 62/8503* (2025.01); *H10D 62/151* (2025.01); *H10D 64/111* (2025.01); *H10D 84/05* (2025.01); *H10D 84/83* (2025.01)

(58) Field of Classification Search

CPC ............. H10D 62/8503; H10D 64/111; H10D 62/151; H10D 84/83; H10D 84/05

See application file for complete search history.

(56) References Cited

U.S. PATENT DOCUMENTS

| | | | | |
|---|---|---|---|---|
| 2015/0357422 A1* | 12/2015 | Liao | .................... | H01L 23/3171 438/172 |
| 2023/0101543 A1* | 3/2023 | Lee | ...................... | H10D 30/015 257/76 |
| 2025/0294852 A1* | 9/2025 | Qian | .................... | H10D 30/475 |

* cited by examiner

*Primary Examiner* — William C Trapanese

(74) *Attorney, Agent, or Firm* — Andrew R. Ralston; Frank D. Cimino

(57) ABSTRACT

In one example, an integrated circuit comprises a transistor and a metal layer. The transistor has an insulator layer over a substrate that includes gallium nitride (GaN). First and second opening in the insulator layer respectively define a drain region and a source region of the transistor. A gate electrode extends into the insulator layer between the source region and the drain region. The metal layer includes a drain via and a source via. The drain via extends through the first opening to the drain region. The source via extends through the second opening to the source region. A source field plate is in the metal layer. The source field plate extends over the gate electrode and provides a contiguous electrically conductive path to the source region.

15 Claims, 19 Drawing Sheets

FIELD PLATES FOR INTEGRATED CIRCUITS

BACKGROUND

Field plates have various uses in semiconductor processing, such as, for example, manipulating or reducing peak electric fields. The manipulation or reduction of peak electric fields may improve device reliability or operation. For example, field plates may allow higher voltages to be achieved in certain semiconductor devices. Certain field plates consist of one or more layers of metal on one or more insulating dielectric layers. Field plates may be arranged parallel to underlying semiconductor materials, such as, for example, those used in forming transistors. The thickness and integrity of certain dielectric films under a field plate may be critical in certain designs. However, the thickness and integrity of an underlying dielectric film may be negatively impacted by certain processes, such as those used in forming an overlying field plate.

SUMMARY

In one example, an integrated circuit comprises a transistor and a metal layer. The transistor has an insulator layer over a substrate that includes gallium nitride (GaN). First and second opening in the insulator layer respectively define a drain region and a source region of the transistor. A gate electrode extends into the insulator layer between the source region and the drain region. The metal layer includes a drain via and a source via. The drain via extends through the first opening to the drain region. The source via extends through the second opening to the source region. A source field plate is in the metal layer. The source field plate extends over the gate electrode and provides a contiguous electrically conductive path to the source region.

In another example, a transistor comprises an insulator layer over a substrate including a semiconductor layer comprising aluminum, gallium and nitrogen. A first opening extends through the insulator layer and into the semiconductor layer defining a drain region. A second opening extends through the insulator layer and into the semiconductor layer defining a source region. A gate electrode of the transistor extends into the insulator layer between the source region and the drain region. A metal layer of the transistor includes noncontiguous first and second portions. The first portion extends into the first opening and touches the semiconductor layer. The second portion extends from the semiconductor layer over the gate electrode to form a source field plate.

In another example, a method includes forming a first opening extending through a first insulating layer to a substrate including gallium nitride (GaN), the first opening defining a drain of a transistor. The method further includes forming a second opening extending through the first insulating layer to the substrate, the second opening defining a source the transistor. The method further includes forming a gate of the transistor extending into the first insulating layer. The method further includes forming a first metal layer over the first insulating layer. The first metal layer has: a first via extending through the first opening to the substrate; a second via extending through the second opening to the substrate; and a first source field plate over the gate. The first source field plate and the second via are contiguous portions of the first metal layer.

BRIEF DESCRIPTION OF THE DRAWINGS

The same reference numbers or other reference designators are used in the drawings to designate the same or similar (functionally and/or structurally) features. Also, the figures are not necessarily drawn to scale.

DETAILED DESCRIPTION

Various integrated circuits (IC) including a stack of two or more field plates over portion of a transistor are disclosed herein. Certain field plate configurations disclosed herein may improve IC reliability or operation. For example, certain field plate configurations may enhance the breakdown voltage of a transistor drain and the critical off-state stress of a transistor gate relative to configurations without any source field plate. The use of multiple field plates may have certain cumulative effects. Certain configurations that use a stack of two field plates, as opposed to three or more, may have relatively lower fabrication costs while still improving reliability. Certain examples disclosed herein facilitate increasing the distance between field plates, which may provide certain technical advantages (e.g., reducing stray capacitance).

In certain instances, the thickness and integrity of layers underlying a field plate may impact reliability. At least one technical drawback of other approaches includes a significant amount of over etching of metal layer(s) underlying field plates. While such over etching may be intended to avoid undesired features, such as metal stringers resulting from certain fabrication processing, the over etching itself may cause certain technical drawbacks. For example, certain over etching processes may risk negatively affecting not only conductive layer(s) subjected to the etch, but also may subject underlying dielectric layer(s) to damaging plasma exposure during the same etch. Such issues are further complicated and compounded by the fact that the amount of over etching, or other factors affecting etch tool performance, may not be uniform across a given wafer, or from wafer lot to wafer lot. In addition, the topology of a wafer surface exposed to certain over etching processes may have undesirable variation, which may make subsequent processes (e.g., etch and clean processes) less robust. The varying topology of certain over etching processes may also limit or otherwise complicate shrinking device or die size, and result in less robust and more costly fabrication.

Accordingly, certain examples disclosed herein provide a stacked configuration of field plates, each located over at least a portion of a transistor. While arrangements of the field plates and the underlying layers upon which the field plates are formed may facilitate certain robust processing techniques and address certain technical drawbacks of other baseline approaches, no particular result is a requirement unless explicitly recited in a particular claim.

Figure 1:
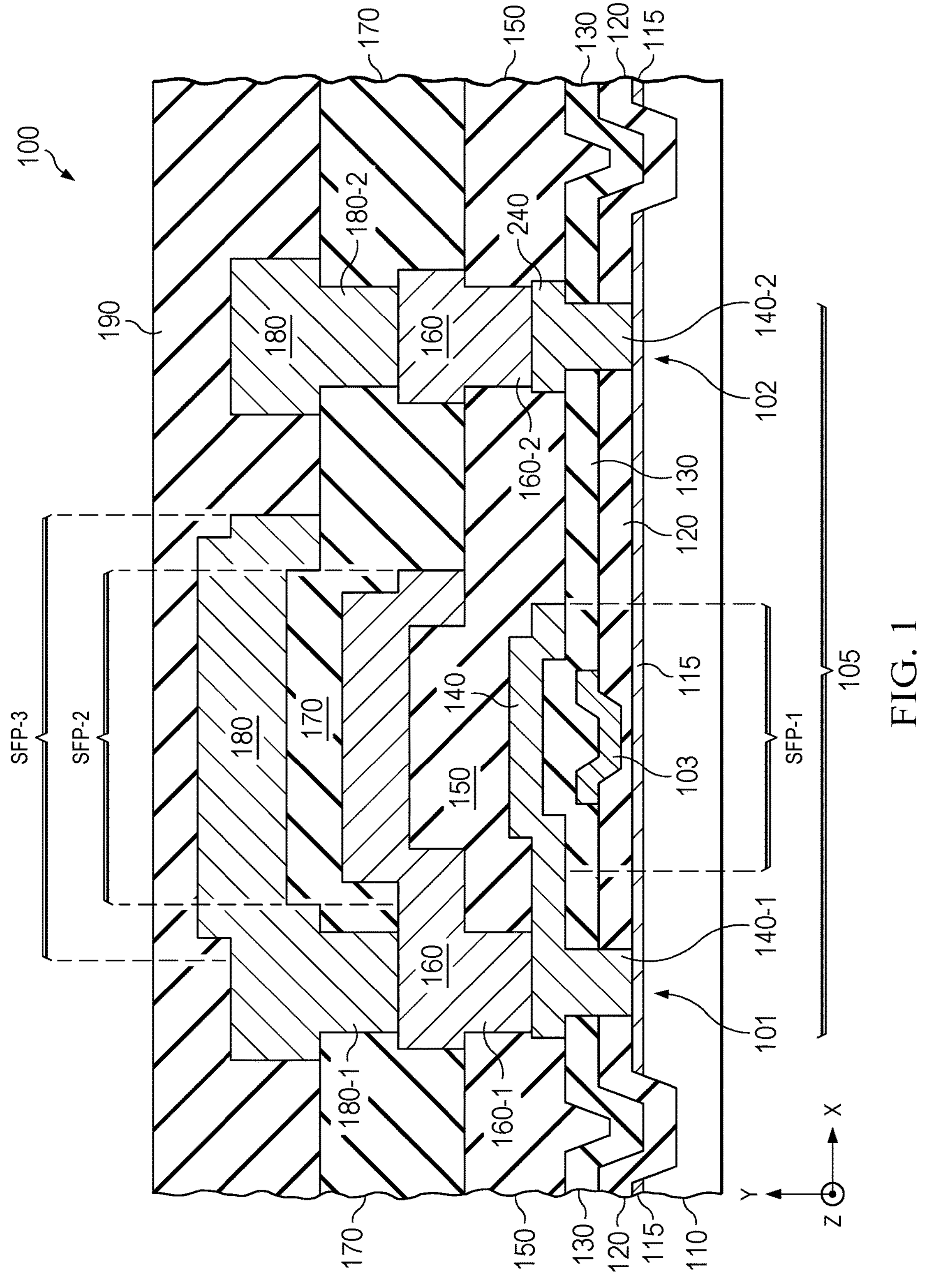
FIG. 1 is a schematic illustrating a cross-sectional view of a portion of an integrated circuit (IC) including a stack of three source field plates over a portion of a transistor.

FIG. 1 is a schematic illustrating a cross-sectional view of a portion of an integrated circuit (IC) 100 including a stack of three source field plates SFP-1, SFP-2 and SFP-3, each extending over a gate 103 of a transistor 105 in a direction parallel to the illustrated x-axis.

IC 100 includes a stack of layers 110-190, in which layer 110 includes a base substrate over which all other layers 120-190 are formed. Each layer may be composed of one or more sub-layers of respective material. In this example, layer 110 includes one or more of aluminum, gallium and nitrogen (e.g., AlGaN, GaN, etc.), layer 115 includes aluminum, gallium and nitrogen, layer 120 includes dielectric material, layer 130 includes dielectric material, layer 140 includes electrically-conductive material, layer 150 includes dielectric material, layer 160 includes electrically-conductive material, layer 170 includes dielectric material, layer 180 includes electrically-conductive material and layer 190 includes dielectric material. Interstitial layers within or between those shown in FIG. 1 may be included in certain examples. In some examples the layer 115 includes a compound with empirical formula $Al_xGa_yN_z$, and the layer 110 includes a compound with empirical formula $Al_mGa_n$. Some examples include a thin AlN barrier (not shown) between the layer 110 and the layer 115. A 2-D electron gas (2DEG) (not shown) may be formed between the layer 110 and the layer 115.

The dielectric material used for a given layer of FIG. 1 may include, for example, one or more of silicon nitride, silicon oxide, silicon oxynitride, etc. However, any suitable dielectric material or combination of dielectric materials may be used. The electrically-conductive material used for a given layer of FIG. 2 may include, for example, one or more of aluminum, copper, aluminum nitride, titanium nitride, titanium tungsten, tungsten, etc. However, any suitable electrically-conductive material or combination of electrically-conductive materials may be used.

IC 100 further includes a transistor 105 having a source 101, a drain 102 and a gate 103. As shown in FIG. 1, gate 103 is located over layer 110, between layers 120 and 130 along a line parallel to the illustrated y-axis and between source 101 and drain 102, wherein gate 103 is located over and spaced apart from a line extending parallel to the x-axis between source 101 and drain 102. In this example, gate 103 includes titanium tungsten (TiW); however, any suitable material may be used to form gate 103.

Layer 140 includes a first via 140-1, a second via 140-2 and a source field plate SFP-1. Via 140-1 extends through layers 120 and 130 in a direction parallel to the y-axis. A base of via 140-1 contacts a surface area of layer 111. Via 140-2 extends through layers 120 and 130 in a direction parallel to the y-axis. A base of via 140-2 contacts a surface area of layer 111. While bottom surfaces of the vias 140-1 and 140-2 are shown level with the top surface of the layer 115, in other examples the vias 140-1 and 140-2 may extend into the layer 115. The 2DEG provides a conductive path between the source 101 at via 140-1 and the drain 102 at via 140-2, with the conductivity controlled by a potential of the gate 103. A portion of SFP-1 is located over gate 103. In this example, layer 140 provides a contiguous electrically-conductive interconnection between SFP-1 and the source 101, but SFP-1 and via 140-2 are non-contiguous and conductively isolated. In this context, a "contiguous electrically-conductive interconnection" includes any electrically conductive barrier and/or liner layers that may be associated with forming the layer 140. Thus the conductive connection between the source 101 and SFP-1 only requires processing the single metal layer 140, as contrasted with some baseline implementations that require processing a first metal layer to form the via connection to the source 101 and a second metal layer to form SFP-1. As described further below, the metal layer 140 may include various barrier layers and/or liner layers to promote reliability or ohmic connection to the layer 115 at the source 101 and the drain 102.

Layer 160 includes a first via 160-1, a second via 160-2 and a source field plate SFP-2. Via 160-1 extends through layer 150 in a direction parallel to the y-axis. A base of via 160-1 contacts a surface area of layer 140 located over via 140-1 and source 101, such that vias 140-1 and 160-1 collectively form an electrically-conductive path parallel to the y-axis. First via 160-1 and SFP-2 form a contiguous metal path from layer 140. Via 160-2 extends through layer 150 in a direction parallel to the y-axis. A base of via 160-2 contacts a surface area of layer 140 that is positioned over via 140-2 and drain 102, such that vias 140-2 and 160-2 collectively form an electrically-conductive path parallel to the y-axis. A portion of SFP-2 is located over SFP-1 and gate 103. In this example, layer 160 provides at least part of an electrically-conductive interconnection between SFP-2 and via 160-1, but SFP-2 and via 160-2 are non-contiguous and conductively isolated.

Layer 180 includes a first via 180-1, a second via 180-2 and a source field plate SFP-3. Via 180-1 extends through layer 170 in a direction parallel to the y-axis. A base of via 180-1 contacts a surface area of layer 160 located over via 160-1, via 140-1, and source 101. Via 160-1 electrically couples via 180-1 to via 140-1, such that vias 140-1, 180-1, and 160-1 collectively form an electrically-conductive path parallel to the y-axis. Via 180-2 extends through layer 170 in a direction parallel to the y-axis. First via 180-1 and SFP-3 form a contiguous metal path from layer 160. A base of via 180-2 contacts a surface area of layer 160 located over via 160-2, via 140-2, and drain 102. Via 160-2 electrically couples via 180-2 to via 140-2, such that vias 140-2, 180-2, and 160-2 collectively form an electrically-conductive path parallel to the y-axis. A portion of SFP-3 is located over SFP-2, SFP-1 and gate 103. In this example, layer 180 provides at least part of an electrically-conductive interconnection nection between SFP-3 and via 180-1, but SFP-3 and via 180-2 are non-contiguous and conductively isolated.

Layer 190 is formed over respective portions of layers 170 and 180. In this example, layer 190 has a thickness sufficient to fully encapsulate at least the illustrated features of layer 480.

Figure 2:
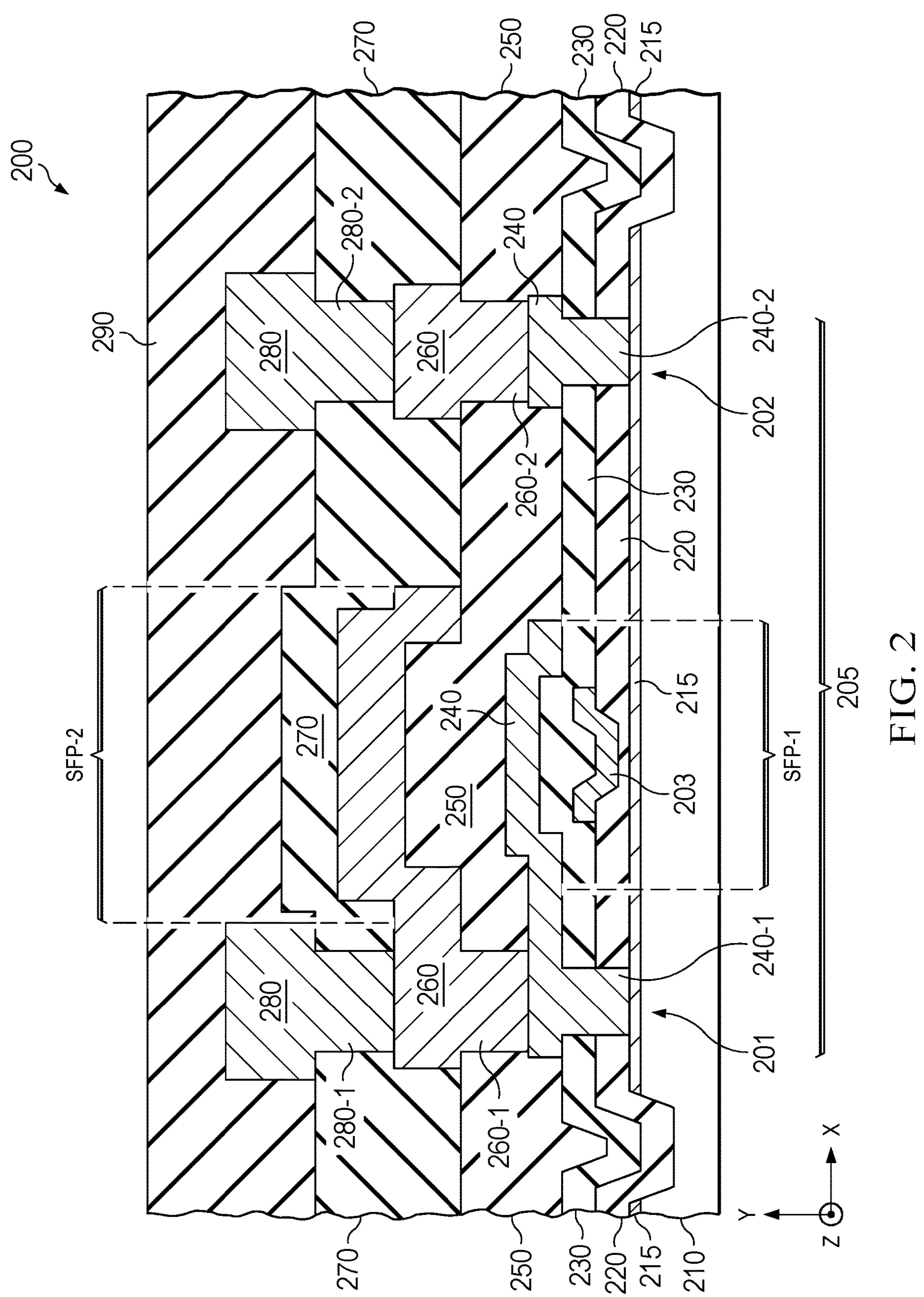
FIG. 2 is a schematic illustrating a cross-sectional view of a portion of an IC including a stack of two source field plates over a portion of a transistor.

FIG. 2 is a schematic illustrating a cross-sectional view of a portion of an IC 200 including a stack of two source field plates SFP-1 and SFP-2, each extending over a gate 203 of a transistor 205 in a direction parallel to the illustrated x-axis. As shown in FIG. 2, the illustrated portion of IC 200 has certain features similar to those described above with reference to IC 100 of FIG. 1. At least one difference between the respective illustrated portions of IC 100 and IC 200 is that IC 100 includes at least three source field plates SFP-1, SFP-2 and SFP-3 over gate 103, while IC 200 includes no more than two source field plates SFP-1 and SFP-2 over gate 203. Using a stack of two source field plates may simplify fabrication processes and reduce fabrication costs, while still sufficiently manipulating or reducing peak electric fields for certain applications.

IC 200 includes a stack of layers 210-290, in which layer 210 includes a base substrate over which all other layers 220-290 are formed. Each layer may be composed of one or more sub-layers of respective material. In this example, layer 210 includes one or more of aluminum, gallium and nitrogen (e.g., AlGaN, GaN, etc.), layer 215 includes aluminum, gallium and nitrogen, layer 220 includes dielectric material, layer 230 includes dielectric material, layer 240 includes electrically-conductive material, layer 250 includes dielectric material, layer 260 includes electrically-conductive material, layer 270 includes dielectric material, layer 280 includes electrically-conductive material and layer 290 includes dielectric material. Interstitial layers within or between those shown in FIG. 2 may be included in certain examples. In some examples the layer 215 includes a compound with empirical formula $Al_xGa_yN_z$, and the layer 210 includes a compound with empirical formula $Al_mGa_n$. Some examples include a thin AlN barrier (not shown) between the layer 210 and the layer 215. A 2-D electron gas (2DEG) (not shown) may be formed between these layers.

The dielectric material used for a given layer of FIG. 2 may include, for example, one or more of silicon nitride, silicon oxide, silicon oxynitride, etc. However, any suitable dielectric material or combination of dielectric materials may be used. The electrically-conductive material used for a given layer of FIG. 2 may include, for example, one or more of aluminum, copper, aluminum nitride, titanium nitride, titanium tungsten, tungsten, etc. However, any suitable electrically-conductive material or combination of electrically-conductive materials may be used.

IC 200 further includes a transistor 205 having a source 201, a drain 202 and a gate 203. As shown in FIG. 2, gate 203 is located over layer 210, between layers 220 and 230 along a line parallel to the y-axis and between source 201 and drain 202, wherein gate 203 is located over and spaced apart from a line extending parallel to the x-axis between source 201 and drain 202. In this example, gate 203 includes titanium tungsten (TiW); however, any suitable material may be used to form gate 203. Source 201 and drain 202 may each be included within layer 210.

Layer 240 includes a first via 240-1, a second via 240-2 and a source field plate SFP-1. Via 240-1 extends through layers 220 and 230 in a direction parallel to the y-axis. A base of via 240-1 contacts a surface area of layer 210 located over source 201. Via 240-2 extends through layers 220 and 230 in a direction parallel to the y-axis. A base of via 240-2 contacts a surface area of layer 210 located over drain 202. A portion of SFP-1 is located over gate 203. In this example, layer 240 provides at least part of a contiguous electrically-conductive interconnection between SFP-1 and the source 201, but SFP-1 and via 240-2 are non-contiguous and conductively isolated.

Layer 260 includes a first via 260-1, a second via 260-2 and a source field plate SFP-2. Via 260-1 extends through layer 250 in a direction parallel to the y-axis. A base of via 260-1 contacts a surface area of layer 240 located over via 240-1 and source 201, such that vias 240-1 and 260-1 collectively form an electrically-conductive path parallel to the y-axis. First via 260-1 and SFP-2 form a contiguous metal path from layer 240. Via 260-2 extends through layer 250 in a direction parallel to the y-axis. A base of via 260-2 contacts a surface area of layer 240 that is positioned over via 240-2 and drain 202, such that vias 240-2 and 260-2 collectively form an electrically-conductive path parallel to the y-axis. A portion of SFP-2 is located over SFP-1 and gate 203. In this example, layer 260 provides at least part of an electrically-conductive interconnection between SFP-2 and via 260-1, but SFP-2 and via 260-2 are non-contiguous and conductively isolated.

Layer 280 includes a first via 280-1 and a second via 280-2. In this example, layer 280 does not include a source field plate over gate 203. Via 280-1 extends through layer 270 in a direction parallel to the y-axis. A base of via 280-1 contacts a surface area of layer 260 located over via 260-1, via 240-1, and source 201. Via 260-1 electrically couples via 280-1 to via 240-1, such that vias 240-1, 260-1, and 280-1 collectively form an electrically-conductive path parallel to the y-axis. Via 280-2 extends through layer 270 in a direction parallel to the y-axis. A base of via 280-2 contacts a surface area of layer 260 located over via 260-2, via 240-2, and drain 202. Via 260-2 electrically couples via 280-2 to via 240-2, such that vias 240-2, 260-2, and 280-2 collectively form an electrically-conductive path parallel to the y-axis.

Layer 290 is formed over respective portions of layers 270 and 280. In this example, layer 290 has a thickness sufficient to fully encapsulate at least the illustrated features of layer 280.

Figure 3:
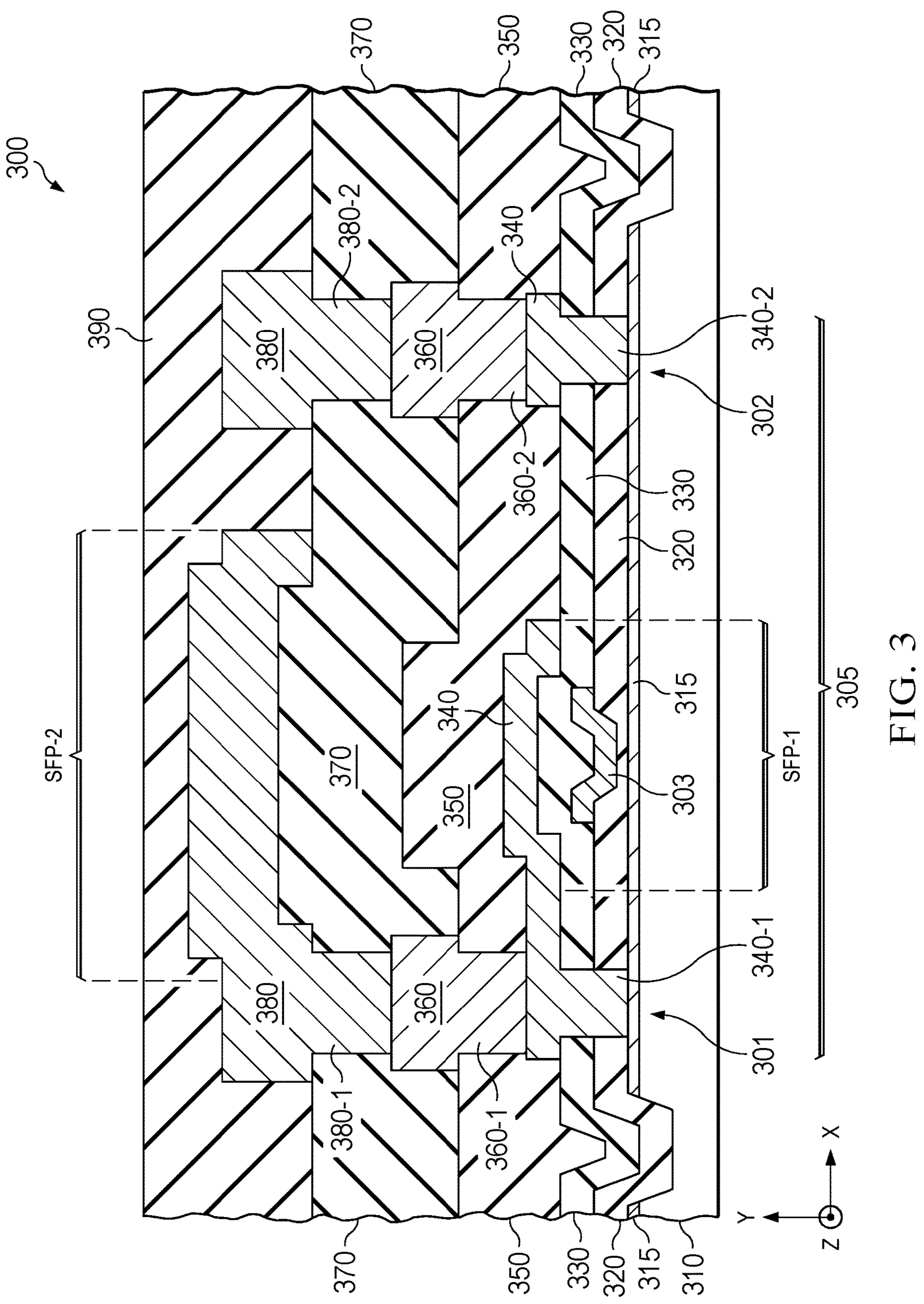
FIG. 3 is a schematic illustrating a cross-sectional view of a portion of an IC including a stack of two source field plates over a portion of a transistor, in which the two source field plates are conductively interconnected by a metal layer disposed therebetween.

FIG. 3 is a schematic illustrating a cross-sectional view of a portion of an IC 300 including a stack of two source field plates SFP-1 and SFP-2, each extending over a gate 303 of a transistor 305 in a direction parallel to the x-axis. As shown in FIG. 3, the illustrated portion of IC 300 has certain features similar to those of IC 100 and IC 200, described herein with reference to FIGS. 1 and 2, respectively. At least one difference between the respective illustrated portions of IC 200 and IC 300 is that IC 300 has a conductive layer 360 between layers 340 and 380, which include source field plates SFP-1 and SFP-2, respectively. Layer 360 provides at least part of an electrically-conductive interconnection between layers 340 and 380, but unlike layers 340 and 380, layer 360 does not include a source field plate over gate 303 in this example.

IC 300 includes a stack of layers 310-390, in which layer 310 includes a base substrate over which all other layers 320-390 are formed. Each layer may be composed of one or more sub-layers of respective material. In this example, layer 310 includes one or more of aluminum, gallium and nitrogen (e.g., AlGaN, GaN, etc.), layer 315 includes aluminum, gallium and nitrogen, layer 320 includes dielectric material, layer 330 includes dielectric material, layer 340 includes electrically-conductive material, layer 350 includes dielectric material, layer 360 includes electrically-conductive material, layer 370 includes dielectric material, layer 380 includes electrically-conductive material and layer 390 includes dielectric material. Interstitial layers within or between those shown in FIG. 3 may be included in certain examples. In some examples the layer 315 includes a compound with empirical formula $Al_xGa_yN_z$, and the layer 310 includes a compound with empirical formula $Al_mGa_n$. Some examples include a thin AlN barrier (not shown) between the layer 310 and the layer 315. A 2-D electron gas (2DEG) (not shown) may be formed between these layers.

The dielectric material used for a given layer of FIG. 3 may include, for example, one or more of silicon nitride, silicon oxide, silicon oxynitride, etc. However, any suitable dielectric material or combination of dielectric materials may be used. The electrically-conductive material used for a given layer of FIG. 3 may include, for example, one or more of aluminum, copper, aluminum nitride, titanium nitride, titanium tungsten, tungsten, etc. However, any suitable electrically-conductive material or combination of electrically-conductive materials may be used.

IC 300 further includes a transistor 305 having a source 301, a drain 302 and a gate 303. As shown in FIG. 3, gate 303 is located over layer 310, between layers 320 and 330 along a line parallel to the y-axis and between source 301 and drain 302, wherein gate 303 is located over and spaced apart from a line extending parallel to the x-axis between source 301 and drain 302. In this example, gate 303 includes titanium tungsten (TiW); however, any suitable material may be used to form gate 303. Source 301 and drain 302 may each be included within layer 310.

Layer 340 includes a first via 340-1, a second via 340-2 and a source field plate SFP-1. Via 340-1 extends through layers 320 and 330 in a direction parallel to the y-axis. A base of via 340-1 contacts a surface area of layer 310 located over source 301. Via 340-2 extends through layers 320 and 330 in a direction parallel to the y-axis. A base of via 340-2 contacts a surface area of layer 310 located over drain 302. A portion of SFP-1 is located over gate 303. In this example, layer 340 provides a contiguous electrically-conductive interconnection between SFP-1 and the source 301, but SFP-1 and via 340-2 are non-contiguous and conductively isolated.

Layer 360 includes a first via 360-1 and a second via 260-2. Via 360-1 extends through layer 350 in a direction parallel to the y-axis. A base of via 360-1 contacts a surface area of layer 340 located over via 340-1 and source 301, such that vias 340-1 and 360-1 collectively form an electrically-conductive path parallel to the y-axis. Via 360-2 extends through layer 350 in a direction parallel to the y-axis. A base of via 360-2 contacts a surface area of layer 340 that is positioned over via 340-2 and drain 302, such that vias 340-2 and 360-2 collectively form an electrically-conductive path parallel to the y-axis. In this example, layer 360 does not include a source field plate over gate 303 and via 360-1 and via 360-2 are non-contiguous and conductively isolated.

Layer 380 includes a first via 380-1, a second via 380-2, and a second source field plate SFP-2. Via 380-1 extends through layer 370 in a direction parallel to the y-axis. A base of via 380-1 contacts a surface area of layer 360 located over via 360-1, via 340-1, and source 301. Via 360-1 electrically couples via 380-1 to via 340-1, such that vias 340-1, 360-1, and 380-1 collectively form an electrically-conductive path parallel to the y-axis. First via 380-1 and SFP-2 form a contiguous metal path from via 360-1. Via 380-2 extends through layer 370 in a direction parallel to the y-axis. A base of via 380-2 contacts a surface area of layer 360 located over via 360-2, via 340-2, and drain 302. Via 360-2 electrically couples via 380-2 to via 340-2, such that vias 340-2, 360-2, and 380-2 collectively form an electrically-conductive path parallel to the y-axis. A portion of SFP-2 is located over SFP-1 and gate 303. In this example, layer 380 provides at least part of an electrically-conductive interconnection between SFP-2 and via 380-1, but SFP-2 and via 380-2 are non-contiguous and conductively isolated.

Layer 390 is formed over respective portions of layers 370 and 380. In this example, layer 390 has a thickness sufficient to fully encapsulate at least the illustrated features of layer 380.

Figure 4:
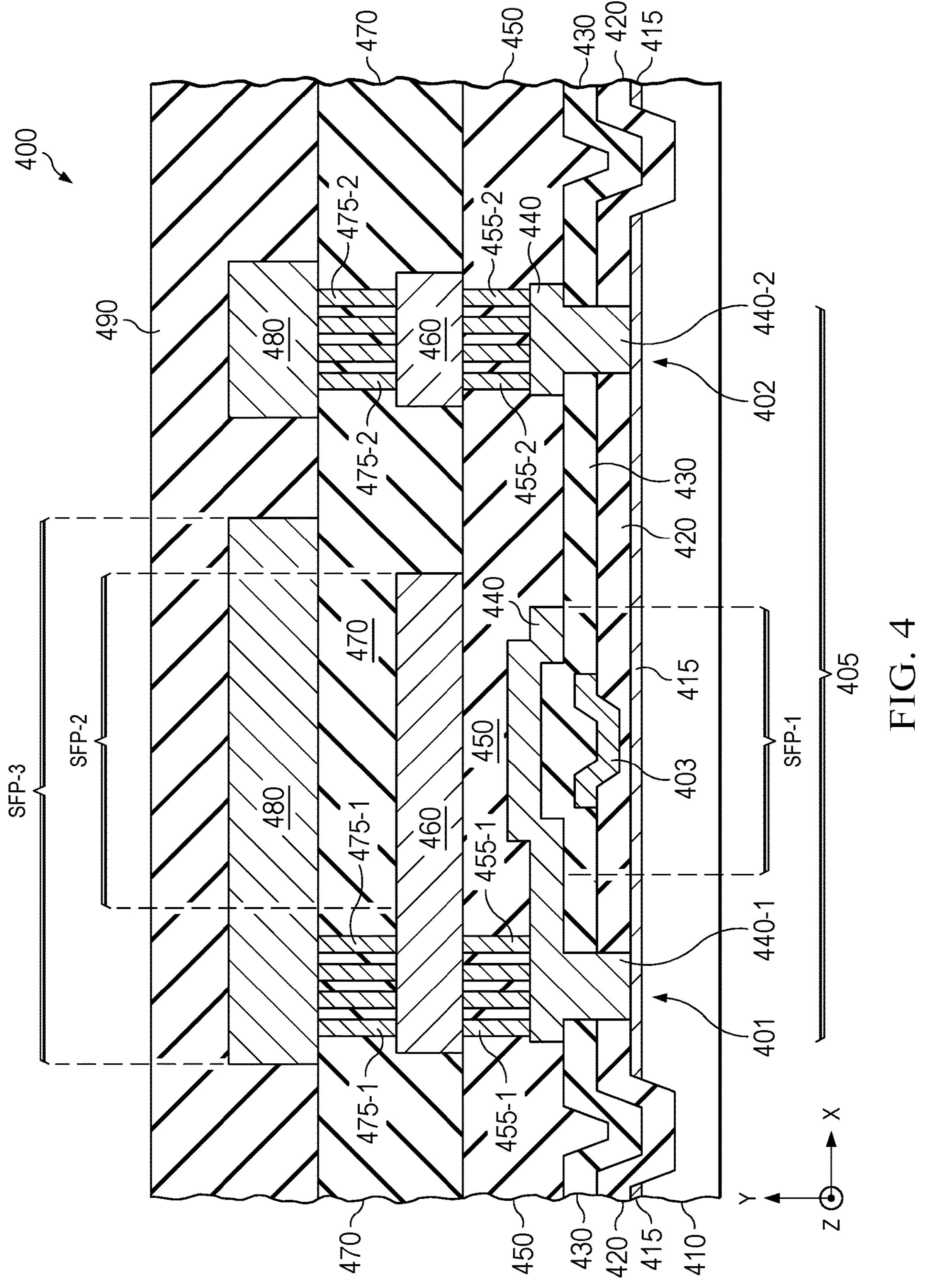
FIG. 4 is a schematic illustrating a cross-sectional view of a portion of an IC including a stack of three metal field plates over a portion of a transistor, in which two of the source field plates are each formed over a respective planarized outward-facing surface of a respective dielectric layer.

FIG. 4 is a schematic illustrating a cross-sectional view of a portion of an IC 400 including a stack of three source field plates SFP-1, SFP-2 and SFP-3, each extending over a gate 403 of a transistor 405 in a direction parallel to the illustrated x-axis. In this example, IC 400 differs from the examples described with reference to FIGS. 1-3 at least in that IC 400 includes multiple source field plates (SFP-2 and SFP-3) that are each formed over a respective planarized surface (the upper surfaces of layers 450 and 470, respectively). In addition, IC 400 also differ from the examples described with reference to FIGS. 1-3 at least in that IC 400 includes two sets of multiple vias 475-1 and 475-2 between layers 480 to layer 460, and another two sets of multiple vias 455-1 and 455-2 between layers 460 layer 440.

IC 400 includes a stack of layers 410-490, in which layer 410 includes a base substrate over which all other layers 420-490 are formed. Each layer may be composed of one or more sub-layers of respective material. In this example, layer 410 includes one or more of aluminum, gallium and nitrogen (e.g., AlGaN, GaN, etc.), layer 415 includes aluminum, gallium and nitrogen, layer 420 includes dielectric material, layer 430 includes dielectric material, layer 440 includes electrically-conductive material, layer 450 includes dielectric material, layer 460 includes electrically-conductive material, layer 470 includes dielectric material, layer 480 includes electrically-conductive material and layer 490 includes dielectric material. Interstitial layers within or between those shown in FIG. 4 may be included in certain examples. In some examples the layer 415 includes a compound with empirical formula $Al_xGa_yN_z$, and the layer 410 includes a compound with empirical formula $Al_mGa_n$. Some examples include a thin AlN barrier (not shown) between the layer 410 and the layer 415. A 2-D electron gas (2DEG) (not shown) may be formed between these layers.

The dielectric material used for a given layer of FIG. 4 may include, for example, one or more of silicon nitride, silicon oxide, silicon oxynitride, etc. However, any suitable dielectric material or combination of dielectric materials may be used. The electrically-conductive material used for a given layer of FIG. 4 may include, for example, one or more of aluminum, copper, aluminum nitride, titanium nitride, titanium tungsten, tungsten, etc. However, any suitable electrically-conductive material or combination of electrically-conductive materials may be used.

IC 400 further includes a transistor 405 having a source 401, a drain 402 and a gate 403. As shown in FIG. 4, gate 403 is located over layer 410, between layers 420 and 430 along a line parallel to the y-axis and between source 401 and drain 402, wherein gate 403 is located over and spaced apart from a line extending parallel to the x-axis between source 401 and drain 402. In this example, gate 403 includes titanium tungsten (TiW); however, any suitable material may be used to form gate 403. Source 401 and drain 402 may each be included within layer 410.

Layer 440 includes a first via 440-1, a second via 440-2 and a source field plate SFP-1. Via 440-1 extends through layers 420 and 430 in a direction parallel to the y-axis. A base of via 440-1 contacts a surface area of layer 410 located over source 401. Via 440-2 extends through layers 420 and 430 in a direction parallel to the y-axis. A base of via 440-2 contacts a surface area of layer 410 located over drain 402. A portion of SFP-1 is located over gate 403. In this example, layer 440 provides a contiguous electrically-conductive interconnection between SFP-1 and the source 401, but SFP-1 and via 440-2 are non-contiguous and conductively isolated.

The fabrication of IC 400 may include a series of processing steps, explained in further detail below. After the formation of layer 450 on layers 430 and 440, columns of layer 450 are selectively removed (e.g., by a photolithographic pattern and subsequent etching) in a manner that creates voids extending along the y-axis. The voids may be subsequently filled by material used to form vias 455-1 and 455-2.

A first set of vias 455-1 and a second set of vias 455-2 are formed within layer 450. Vias 455-1 each extend through layer 450 in a direction parallel to the y-axis. Each respective base of vias 455-1 contacts a surface area of layer 440 located over via 440-1 and source 401, such that vias 455-1 collectively form parallel electrically-conductive paths to layer 440, which provides an electrically-conductive path to layer 410. Vias 455-2 each extend through layer 450 in a direction parallel to the y-axis. Each respective base of vias 455-2 contacts a surface area of layer 440 that is positioned over via 440-2 and drain 402, such that vias 455-2 collectively form parallel electrically-conductive paths to layer 440, which provides an electrically-conductive path to layer 410.

After the formation of vias 455-1 and 455-2, layer 450 may be subjected to one or more planarizing processes, such as, for example, a chemical-mechanical polish (CMP). The planarizing process(es) may result in layer 450 having a substantially planar, outward-facing surface upon which other layers (e.g., layer 460) may be formed. The planarizing process may also result in vias 455-1 and 455-2 having an outward-facing surface that is substantially coplanar with the outward facing, planarized surface of layer 450.

In this example, layer 460 is formed on the planarized outward-facing surface of layer 450 and on the outward-facing surfaces of vias 455-1 and 455-2. Layer 460 includes a source field plate SFP-2. As shown in FIG. 4, SFP-2 may have an inward-facing surface that is in contact with or otherwise confirms to an outward-facing, planarized surface of layer 450 and that is substantially planar along a plane extending from an outward surface of each of the vias 455-1 to an opposite end of SFP-2. In this example layer 460 provides at least part of an electrically-conductive interconnection between SFP-2 and vias 455-1 and vias 475-1, but SFP-2 is non-contiguous with and conductively isolated from vias 455-2 and vias 472-2.

After the formation of layer 470 on layers 450 and 460, columns of layer 470 are selectively removed (e.g., by a photolithographic pattern and subsequent etching) in a manner that creates voids extending along the y-axis. The voids may be subsequently filled by material used to form vias 475-1 and 475-2.

After the selective removal of layer 470, a first set of vias 475-1 and a second set of vias 475-2 are formed. Vias 475-1 each extend through layer 470 in a direction parallel to the y-axis. Each respective base of vias 475-1 contacts a surface area of layer 460 located over vias 455-1, via 440-1 and source 401, such that vias 475-1 collectively form parallel electrically-conductive paths to layer 460, which conductively interconnects vias 457-1 to vias 455-1. Vias 475-2 each extend through layer 470 in a direction parallel to the y-axis. Each respective base of vias 475-2 contacts a surface area of layer 460 located over vias 455-2, via 440-2 and drain 402, such that vias 475-2 collectively form parallel electrically-conductive paths to a portion of layer 460, which conductively interconnects vias 457-2 to vias 455-2.

After the formation of vias 475-1 and 475-2, layer 470 may be subjected to one or more planarizing processes (e.g., CMP). The planarizing process(es) may result in layer 470 having a substantially planar, outward-facing surface upon which other layers (e.g., layer 480) may be formed. The planarizing process may also result in vias 475-1 and 475-2 having an outward-facing surface that is substantially coplanar with the outward facing, planarized surface of layer 470.

In this example, layer 480 is formed on the planarized outward-facing surface of layer 470 and on the outward-facing surfaces of vias 475-1 and 475-2. Layer 480 includes a source field plate SFP-3. As shown in FIG. 4, SFP-3 may have an inward-facing surface that is in contact with or otherwise confirms to an outward-facing, planarized surface of layer 470 and that is substantially planar along a plane extending from an outward-facing surfaces of each of the vias 475-1 to an opposite end of SFP-3. In this example layer 480 provides at least part of an electrically-conductive interconnection between SFP-3 and vias 475-1, but SFP-3 and vias 475-2 are non-contiguous and conductively isolated.

Layer 490 is formed over respective portions of layers 470 and 480. In this example, layer 490 has a thickness sufficient to fully encapsulate at least the illustrated features of layer 480, including SFP-2.

Figure 5:
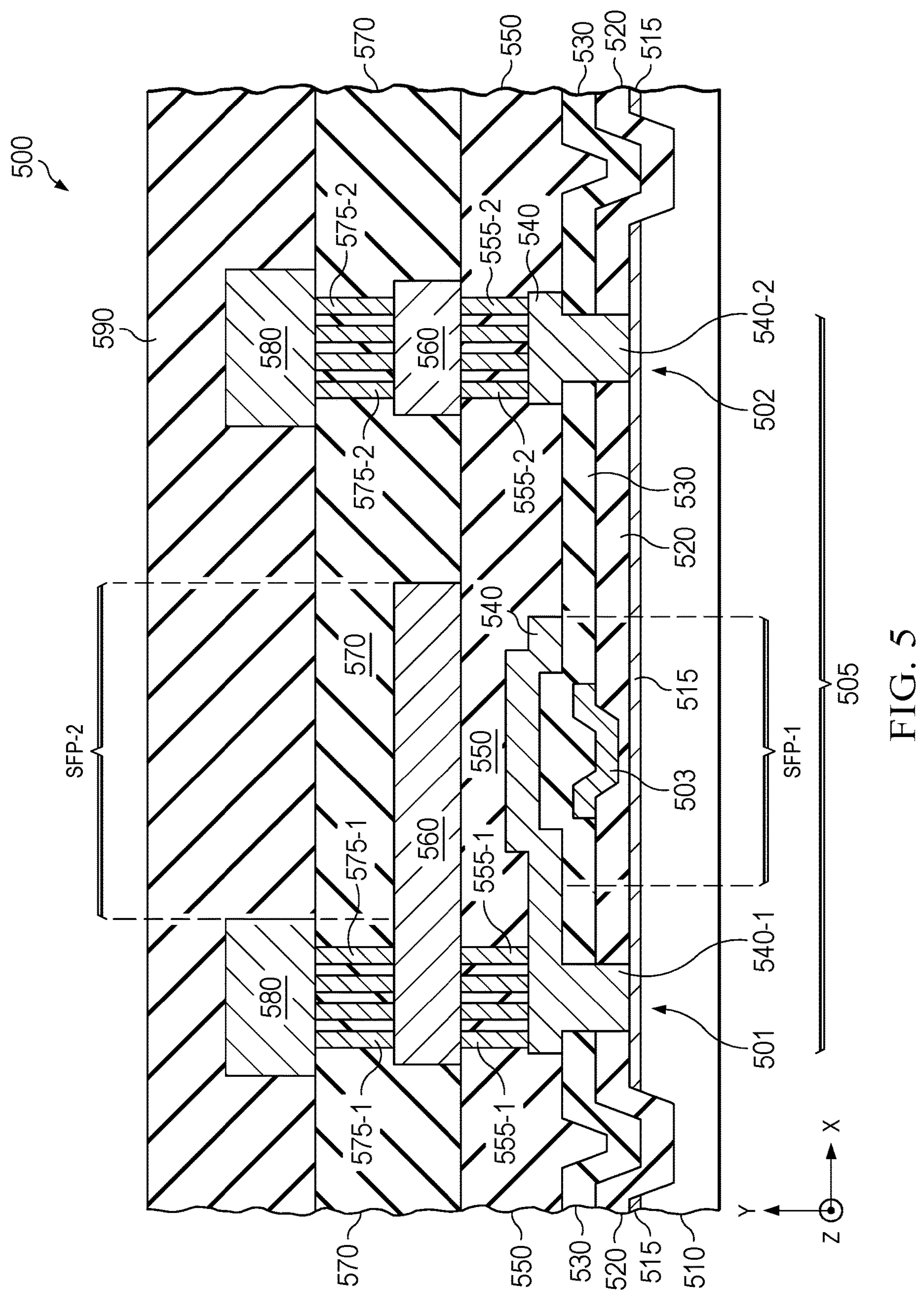
FIG. 5 is a schematic illustrating a cross-sectional view of a portion of an IC including a stack of two source field plates over a portion of a transistor, in which one of the source field plates is formed over a planarized outward-facing surface of a dielectric layer.

FIG. 5 is a schematic illustrating a cross-sectional view of a portion of an IC 500 including a stack of two source field plates SFP-1 and SFP-2, each extending over a gate 503 of a transistor 505 in a direction parallel to the x-axis. In this example, IC 500 differs from the examples described with reference to FIGS. 1-3 at least in that IC 500 includes at least one source field plate SFP-2 formed over planarized outward-facing surfaces of underlying layers (e.g., layer 550 and the outward-facing surfaces of vias 555-1 and 555-2). In addition, IC 500 also differs from the examples described with reference to FIGS. 1-3 at least in that IC 500 includes two sets of multiple vias 575-1 and 575-2 located between layers 580 and layer 560, and another two sets of multiple vias 555-1 and 555-2 between layers 560 and layer 540.

IC 500 includes a stack of layers 510-590, in which layer 510 includes a base substrate over which all other layers 520-590 are formed. Each layer may be composed of one or more sub-layers of respective material. In this example, layer 510 includes one or more of aluminum, gallium and nitrogen (e.g., AlGaN, GaN, etc.), layer 515 includes aluminum, gallium and nitrogen, layer 520 includes dielectric material, layer 530 includes dielectric material, layer 540 includes electrically-conductive material, layer 550 includes dielectric material, layer 560 includes electrically-conductive material, layer 570 includes dielectric material, layer 580 includes electrically-conductive material and layer 590 includes dielectric material. Interstitial layers within or between those shown in FIG. 5 may be included in certain examples. In some examples the layer 515 includes a compound with empirical formula $Al_xGa_yN_z$, and the layer 510 includes a compound with empirical formula $Al_mGa_n$. Some examples include a thin AlN barrier (not shown) between the layer 510 and the layer 515. A 2-D electron gas (2DEG) (not shown) may be formed between these layers.

The dielectric material used for a given layer of FIG. 5 may include, for example, one or more of silicon nitride, silicon oxide, silicon oxynitride, etc. However, any suitable dielectric material or combination of dielectric materials may be used. The electrically-conductive material used for a given layer of FIG. 5 may include, for example, one or more of aluminum, copper, aluminum nitride, titanium nitride, titanium tungsten, tungsten, etc. However, any suitable electrically-conductive material or combination of electrically-conductive materials may be used.

IC 500 further includes a transistor 505 having a source 501, a drain 502 and a gate 503. As shown in FIG. 5, gate 503 is located over layer 510, between layers 520 and 530 along a line parallel to the y-axis and between source 501 and drain 502, wherein gate 503 is located over and spaced apart from a line extending parallel to the x-axis between source 501 and drain 502. In this example, gate 503 includes titanium tungsten (TiW); however, any suitable material may be used to form gate 503. Source 501 and drain 502 may each be included within layer 510.

Layer 540 includes a first via 540-1, a second via 540-2 and a source field plate SFP-1. Via 540-1 extends through layers 520 and 530 in a direction parallel to the y-axis. A base of via 540-1 contacts a surface area of layer 510 located over source 501. Via 540-2 extends through layers 520 and 530 in a direction parallel to the y-axis. A base of via 540-2 contacts a surface area of layer 510 located over drain 502. A portion of SFP-1 is located over gate 503. In this example, layer 540 provides a contiguous electrically-conductive interconnection between SFP-1 and the source 501, but SFP-1 and via 540-2 are non-contiguous and conductively isolated.

The fabrication of IC 500 may include a series of processing steps, explained in further detail below. After the formation of layer 550 on layers 530 and 540, columns of layer 550 are selectively removed (e.g., by a photolithographic pattern and subsequent etching) in a manner that creates voids extending along the y-axis. The voids may be subsequently filled by material used to form vias 555-1 and 555-2.

After the selective removal of layer 550, a first set of vias 555-1 and a second set of vias 555-2 are formed. Vias 555-1 each extend through layer 550 in a direction parallel to the y-axis. Each respective base of vias 555-1 contacts a surface area of layer 540 located over via 540-1 and source 501, such that vias 555-1 collectively form parallel electrically-conductive paths to layer 540, which provides an electrically-conductive path to layer 510. Vias 555-2 each extend through layer 550 in a direction parallel to the y-axis. Each respective base of vias 555-2 contacts a surface area of layer 540 that is positioned over via 540-2 and drain 502, such that vias 555-2 collectively form parallel electrically-conductive paths to layer 540, which provides an electrically-conductive path to layer 510. In this example, layer 560 does not include a source field plate over gate 503 and layer 560 does not conductively interconnect 560-1 and via 560-2.

After the formation of vias 555-1 and 555-2, layer 550 may be subjected to one or more planarizing processes (e.g., CMP). The planarizing process(es) may result in layer 550 having a substantially planar, outward-facing surface upon which other layers (e.g., layer 560) may be formed. The planarizing process may also result in vias 555-1 and 555-2 having an outward-facing surface that is substantially coplanar with the outward facing, planarized surface of layer 550.

In this example, layer 560 is formed on the planarized outward-facing surface of layer 550 and on the outward-facing surfaces of vias 555-1 and 555-2. Layer 560 includes a source field plate SFP-2. As shown in FIG. 5, SFP-2 may have an inward-facing surface that is in contact with or otherwise confirms to an outward-facing, planarized surface of layer 550 and that is substantially planar along a plane extending from an outward surface of each of the vias 555-1 to an opposite end of SFP-2. In this example layer 560 provides at least part of an electrically-conductive interconnection between SFP-2 and vias 555-1 and vias 575-1, but layer 560 does not conductively interconnect SFP-2 to vias 555-2 or to vias 572-2.

After the formation of layer 570 on layers 550 and 560, columns of layer 570 are selectively removed (e.g., by a photolithographic pattern and subsequent etching) in a manner that creates voids extending along the y-axis. The voids may be subsequently filled by material used to form vias 575-1 and 575-2.

After the selective removal of layer 570, a first set of vias 575-1 and a second set of vias 575-2 are formed. Vias 575-1 each extend through layer 570 in a direction parallel to the y-axis. Each respective base of vias 575-1 contacts a surface area of layer 560 located over vias 555-1, via 540-1 and source 501, such that vias 575-1 collectively form parallel electrically-conductive paths to layer 560, which provides at least part of an electrically-conductive interconnection between vias 557-1 and vias 555-1. Vias 575-2 each extend through layer 570 in a direction parallel to the y-axis. Each respective base of vias 575-2 contacts a surface area of layer 560 located over vias 555-2, via 540-2 and drain 502, such that vias 575-2 collectively form parallel electrically-conductive paths to a portion of layer 560, which conductively interconnects vias 557-2 and vias 555-2.

After the formation of vias 575-1 and 575-2, layer 570 may be subjected to one or more planarizing processes (e.g., CMP). The planarizing process(es) may result in layer 570 having a substantially planar, outward-facing surface upon which other layers (e.g., layer 580) may be formed. The planarizing process may also result in vias 575-1 and 575-2 having an outward-facing surface that is substantially coplanar with the outward facing, planarized surface of layer 570.

In this example, layer 580 is formed on the planarized outward-facing surface of layer 570 and on the outward-facing surfaces of vias 575-1 and 575-2. As shown in FIG. 5, portions of layer 580 may be selectively removed to form multiple features. A first feature of layer 580 may be located over vias 575-1, a portion layer 560 electrically connected to SFP-2, vias 555-1, via 540-1 and source 501. A second feature of layer 580 may be located over vias 575-2, a portion layer 560 not electrically connected to SFP-2, vias 555-2, via 540-2 and drain 502.

Layer 590 is formed over respective portions of layers 570 and 580. In this example, layer 590 has a thickness sufficient to fully encapsulate at least the illustrated features of layer 580.

Figure 6:
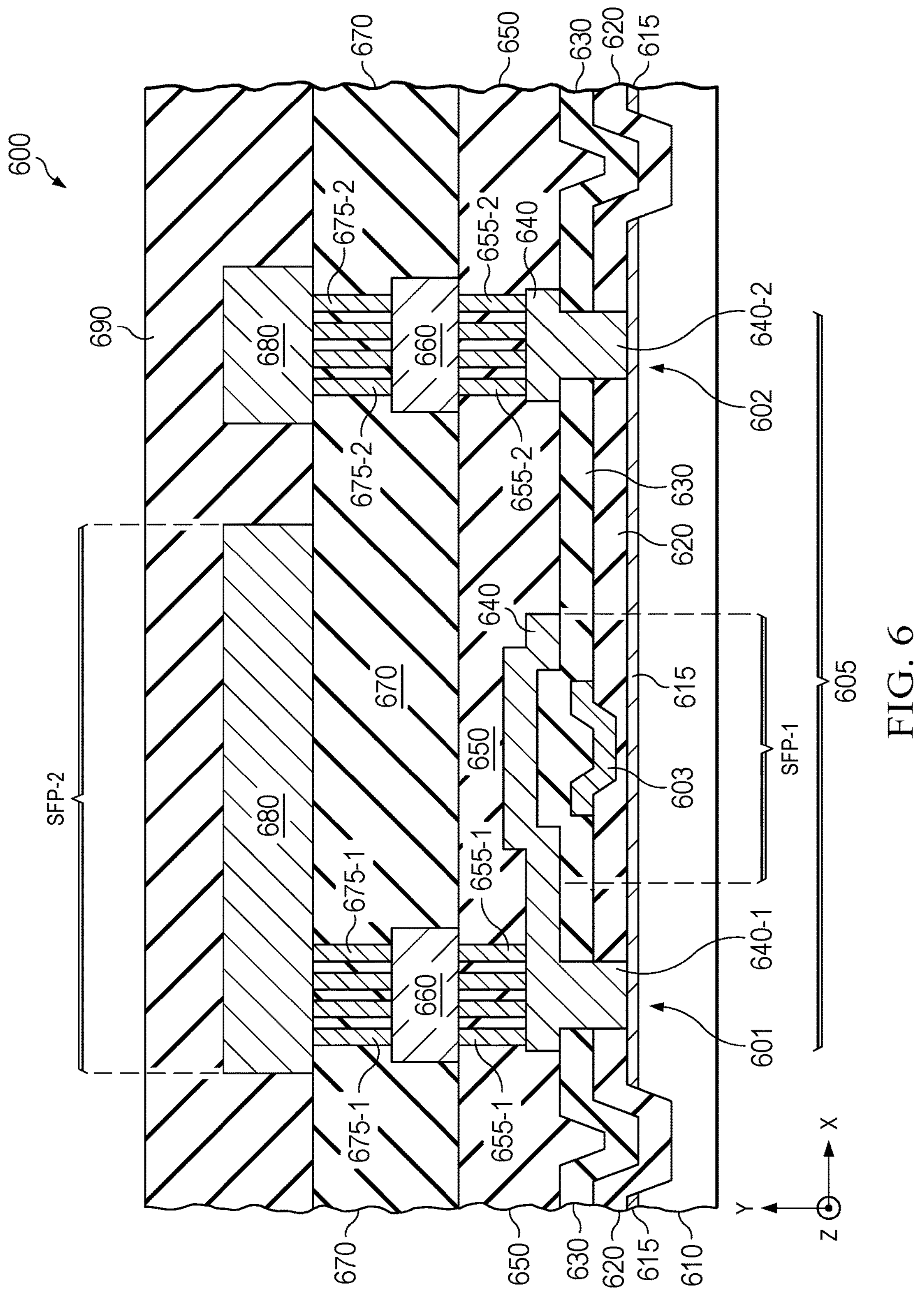
FIG. 6 is a schematic illustrating a cross-sectional view of a portion of an IC including a stack of two metal field plates over the source of a transistor, in which one of the source field plates is formed over a planarized outward-facing surface of a dielectric layer and the two source field plates are conductively interconnected by metal layers disposed therebetween.

FIG. 6 is a schematic illustrating a cross-sectional view of a portion of an IC 600 including a stack of two source field plates SFP-1 and SFP-2, each extending over a gate 603 of a transistor 605 in a direction parallel to the x-axis. In this example, IC 600 differs from the examples described with reference to FIGS. 1-3 at least in that IC 600 includes at least one source field plate SFP-2 formed over planarized outward-facing surfaces of underlying layers (e.g., layer 670 and the outward-facing surfaces of vias 675-1 and 675-2). In addition, IC 600 also differs from the examples described with reference to FIGS. 1-3 at least in that IC 600 includes two sets of multiple vias 675-1 and 675-2 located between layers 680 and layer 660, and another two sets of multiple vias 655-1 and 655-2 between layers 660 and layer 640.

IC 600 includes a stack of layers 610-690, in which layer 610 includes a base substrate over which all other layers 620-690 are formed. Each layer may be composed of one or more sub-layers of respective material. In this example, layer 610 includes one or more of aluminum, gallium and nitrogen (e.g., AlGaN, GaN, etc.), layer 615 includes aluminum, gallium and nitrogen, layer 620 includes dielectric material, layer 630 includes dielectric material, layer 640 includes electrically-conductive material, layer 650 includes dielectric material, layer 660 includes electrically-conductive material, layer 670 includes dielectric material, layer 680 includes electrically-conductive material and layer 690 includes dielectric material. Interstitial layers within or between those shown in FIG. 6 may be included in certain examples. In some examples the layer 615 includes a compound with empirical formula $Al_xGa_yN_z$, and the layer 615 includes a compound with empirical formula $Al_mGa_n$. Some examples include a thin AlN barrier (not shown) between the layer 610 and the layer 615. A 2-D electron gas (2DEG) (not shown) may be formed between these layers.

The dielectric material used for a given layer of FIG. 6 may include, for example, one or more of silicon nitride, silicon oxide, silicon oxynitride, etc. However, any suitable dielectric material or combination of dielectric materials may be used. The electrically-conductive material used for a given layer of FIG. 6 may include, for example, one or more of aluminum, copper, aluminum nitride, titanium nitride, titanium tungsten, tungsten, etc. However, any suitable electrically-conductive material or combination of electrically-conductive materials may be used.

IC 600 further includes a transistor 605 having a source 601, a drain 602 and a gate 603. As shown in FIG. 6, gate 603 is located over layer 610, between layers 620 and 630 along a line parallel to the y-axis and between source 601 and drain 602, wherein gate 603 is located over and spaced apart from a line extending parallel to the x-axis between source 601 and drain 602. In this example, gate 603 includes titanium tungsten (TiW); however, any suitable material may be used to form gate 603. Source 601 and drain 602 may each be included within layer 610.

Layer 640 includes a first via 640-1, a second via 640-2 and a source field plate SFP-1. Via 640-1 extends through layers 620 and 630 in a direction parallel to the y-axis. A base of via 640-1 contacts a surface area of layer 610 located over source 601. Via 640-2 extends through layers 620 and 630 in a direction parallel to the y-axis. A base of via 640-2 contacts a surface area of layer 610 located over drain 602. A portion of SFP-1 is located over gate 603. In this example, layer 640 provides a contiguous electrically-conductive interconnection between SFP-1 and the source 601, but SFP-1 and via 640-2 are non-contiguous and conductively isolated.

The fabrication of IC 600 may include a series of processing steps, explained in further detail below. After the formation of layer 650 on layers 630 and 640, columns of layer 650 are selectively removed (e.g., by a photolithographic pattern and subsequent etching) in a manner that creates voids extending along the y-axis. The voids may be subsequently filled by material used to form vias 655-1 and 655-2.

After the selective removal of layer 650, a first set of vias 655-1 and a second set of vias 655-2 are formed. Vias 655-1 each extend through layer 650 in a direction parallel to the y-axis. Each respective base of vias 655-1 contacts a surface area of layer 640 located over via 640-1 and source 601, such that vias 655-1 collectively form parallel electrically-conductive paths to layer 640, which provides an electrically-conductive path to layer 610. Vias 655-2 each extend through layer 650 in a direction parallel to the y-axis. Each respective base of vias 655-2 contacts a surface area of layer 640 that is positioned over via 640-2 and drain 602, such that vias 655-2 collectively form parallel electrically-conductive paths to layer 540, which provides an electrically-conductive path to layer 610. In this example, layer 660 does not include a source field plate over gate 603 and layer 660 does not conductively interconnect via 660-1 and via 660-2.

After the formation of vias 655-1 and 655-2, layer 650 may be subjected to one or more planarizing processes (e.g., CMP). The planarizing process(es) may result in layer 650 having a substantially planar, outward-facing surface upon which other layers (e.g., layer 660) may be formed. The planarizing process may also result in vias 655-1 and 655-2 having an outward-facing surface that is substantially coplanar with the outward facing, planarized surface of layer 650.

In this example, layer 660 is formed on the planarized outward-facing surface of layer 550 and on the outward-facing surfaces of vias 655-1 and 655-2. As shown in FIG. 6, portions of layer 660 may be selectively removed to form multiple features. A first feature of layer 660 may be located over vias 655-1, via 640-1 and source 601. A second feature of layer 660 may be located over vias 655-2, via 640-2 and drain 602.

After the formation of layer 670 on layers 660 and 660, columns of layer 670 are selectively removed (e.g., by a photolithographic pattern and subsequent etching) in a manner that creates voids extending along the y-axis. The voids may be subsequently filled by material used to form vias 675-1 and 675-2.

After the selective removal of layer 670, a first set of vias 675-1 and a second set of vias 675-2 are formed. Vias 675-1 each extend through layer 670 in a direction parallel to the y-axis. Each respective base of vias 675-1 contacts a surface area of layer 660 located over vias 655-1, via 640-1 and source 601, such that vias 675-1 collectively form parallel electrically-conductive paths to layer 660, which conductively interconnects vias 657-1 and vias 655-1. Vias 675-2 each extend through layer 670 in a direction parallel to the y-axis. Each respective base of vias 675-2 contacts a surface area of layer 660 located over vias 655-2, via 640-2 and drain 602, such that vias 675-2 collectively form parallel electrically-conductive paths to a portion of layer 660, which conductively interconnects vias 657-2 and vias 655-2.

After the formation of vias 675-1 and 675-2, layer 670 may be subjected to one or more planarizing processes (e.g., CMP). The planarizing process(es) may result in layer 670 having a substantially planar, outward-facing surface upon which other layers (e.g., layer 680) may be formed. The planarizing process may also result in vias 675-1 and 675-2 having an outward-facing surface that is substantially coplanar with the outward facing, planarized surface of layer 670.

In this example, layer 680 is formed on the planarized outward-facing surface of layer 670 and on the outward-facing surfaces of vias 675-1 and 675-2. Layer 680 includes a second source field plate SFP-2. As shown in FIG. 6, SFP-2 may have an inward-facing surface that is in contact with or otherwise confirms to an outward-facing, planarized surface of layer 670 and that is substantially planar along a plane extending from an outward-facing surfaces of each of the vias 675-1 to an opposite end of SFP-2. In this example layer 680 conductively interconnects SFP-2 and vias 675-1, but layer 680 does not conductively interconnect SFP-2 and vias 675-2.

Layer 690 is formed over respective portions of layers 670 and 680. In this example, layer 690 has a thickness sufficient to fully encapsulate at least the illustrated features of layer 680, including SFP-2.

FIGS. 7A-7M are schematics collectively illustrating a cross-sectional view of a portion of an IC 700 at respective stages of fabrication. The illustrated fabrication stages may be used, for example, in fabricating corresponding portions of the ICs 400 and 500 described above with reference to FIGS. 4 and 5, respectively. In this example, IC 700 includes a stack of at least two source field plates SFP-1 and SFP-2, each extending over a gate 703 of a transistor 705 in a direction parallel to the x-axis.

IC 700 includes a stack of layers 710-760, in which layer 710 includes a base substrate over which all other layers 720-790 are formed. IC 700 may further include additional layers formed over layer 750, such as, for example, additional layers similar to layers 460-490 or layers 560-590 described herein with reference to FIGS. 4 and 5, respectively.

Each layer may be composed of one or more sub-layers of respective material. In this example, layer 710 includes one or more of aluminum, gallium and nitrogen (e.g., AlGaN, GaN, etc.), layer 715 includes aluminum, gallium and nitrogen, layer 720 includes dielectric material, layer 730 includes dielectric material, layer 740 includes electrically-conductive material, layer 750 includes dielectric material and layer 760 includes electrically-conductive material. Interstitial layers within or between those shown in FIG. 7 may be included in certain examples. In some examples the layer 715 includes a compound with empirical formula $Al_xGa_yN_z$, and the layer 710 includes a compound with empirical formula $Al_mGa_n$. Some examples include a thin AlN barrier (not shown) between the layer 710 and the layer 715.

The dielectric material used for a given layer of FIG. 7 may include, for example, one or more of silicon nitride, silicon oxide, silicon oxynitride, etc. However, any suitable dielectric material or combination of dielectric materials may be used. The electrically-conductive material used for a given layer of FIG. 7 may include, for example, one or more of aluminum, copper, aluminum nitride, titanium nitride, titanium tungsten, tungsten, etc. However, any suitable electrically-conductive material or combination of electrically-conductive materials may be used.

Figures 7A, 7B:
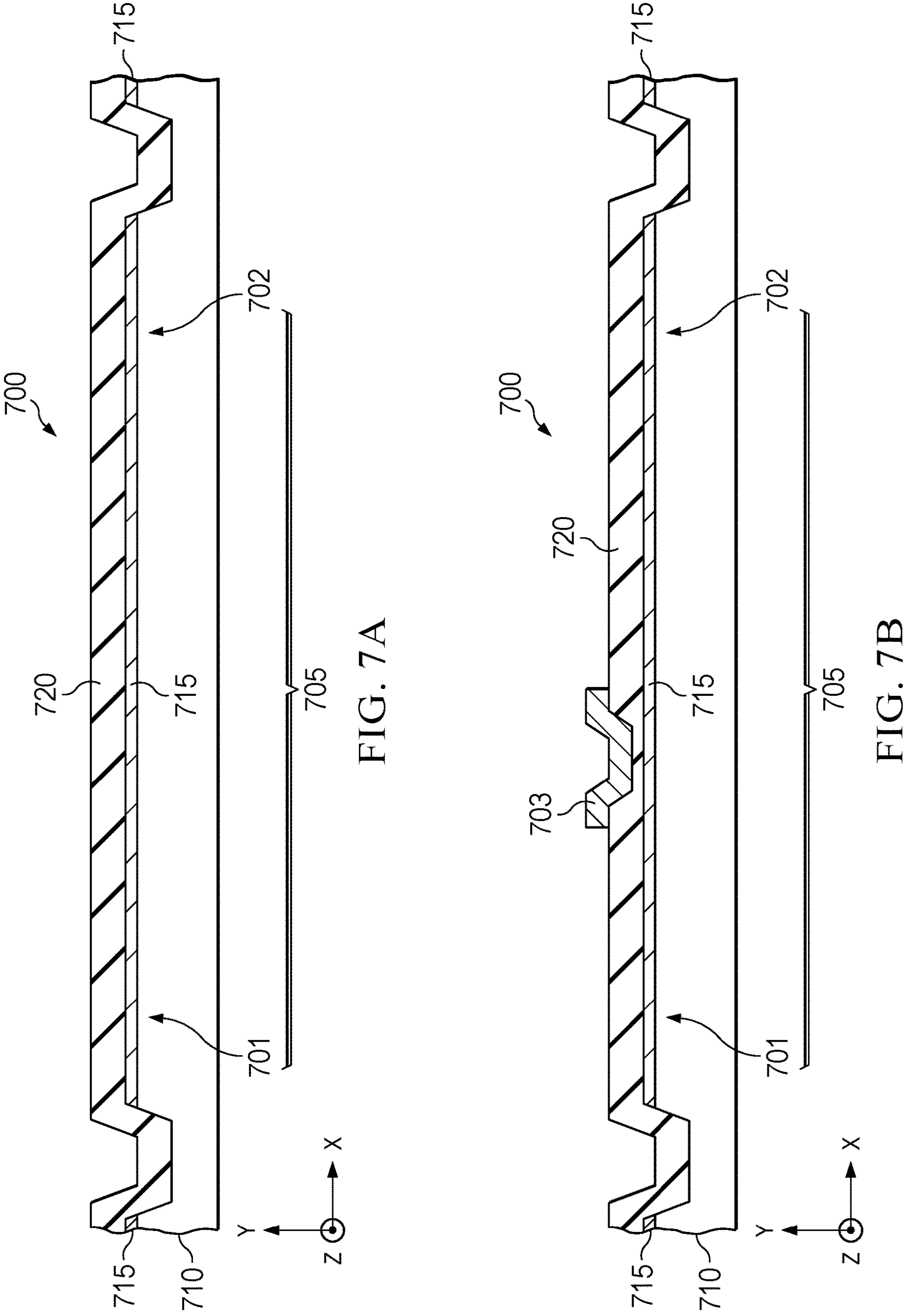
FIGS. 7A-7M are schematics collectively illustrating a cross-sectional view of a portion of an IC at respective stages of fabrication.

As shown in FIG. 7A, portions of a transistor 705, including a source 701 and drain 702 are formed within layer 710. Respective electrical interconnections to source 701 and drain 702 (not explicitly shown) may also be formed within layer 710. Layer 720 is formed over layer 710.

As shown in FIG. 7B, a gate 703 of transistor 705 is formed over layer 720. Electrical interconnections to gate 703 (not explicitly shown) may also be formed over layer 720.

Figures 7C, 7D:
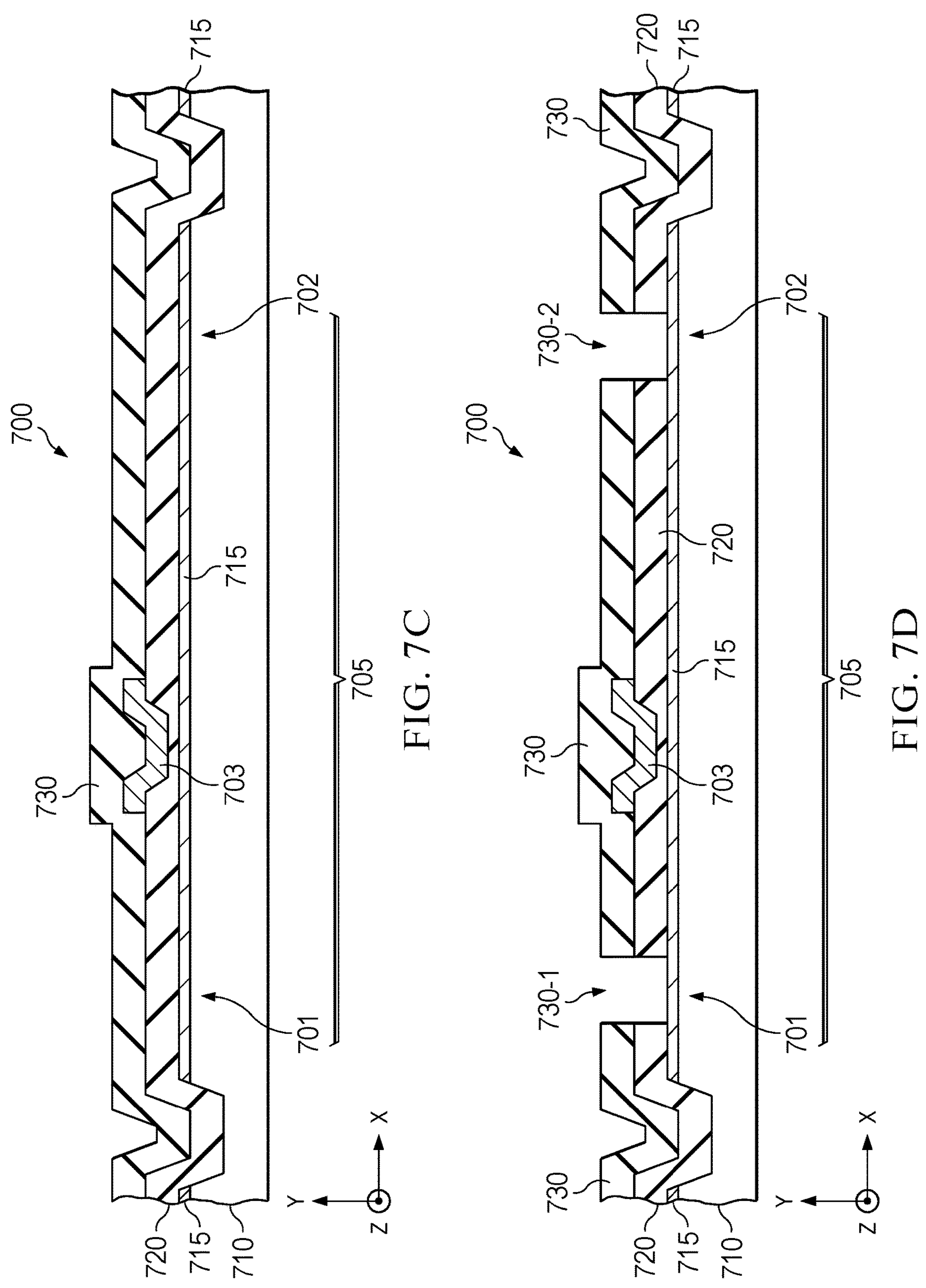

As shown in FIG. 7C, layer 730 is formed over layer 720 and over the gate 703 of transistor 705.

FIG. 7D illustrates the result of a selective removal of portions of at least layers 720 and 730. The selective removal of portions of layers 720 and 730 may be effected, for example, through pattern, etch, and clean processes. The selected removal of portions of layers 720 and 730 results in at least a first void 730-1 located over source 701 and a second void 730-2 located over drain 702. The first and second voids 730-1 and 730-2 each extend completely through layers 720 and 730 in respective directions parallel to the y-axis. The first and second voids 730-1 and 730-2 each expose respective outward-facing surfaces of layer 710.

Figure 7E:
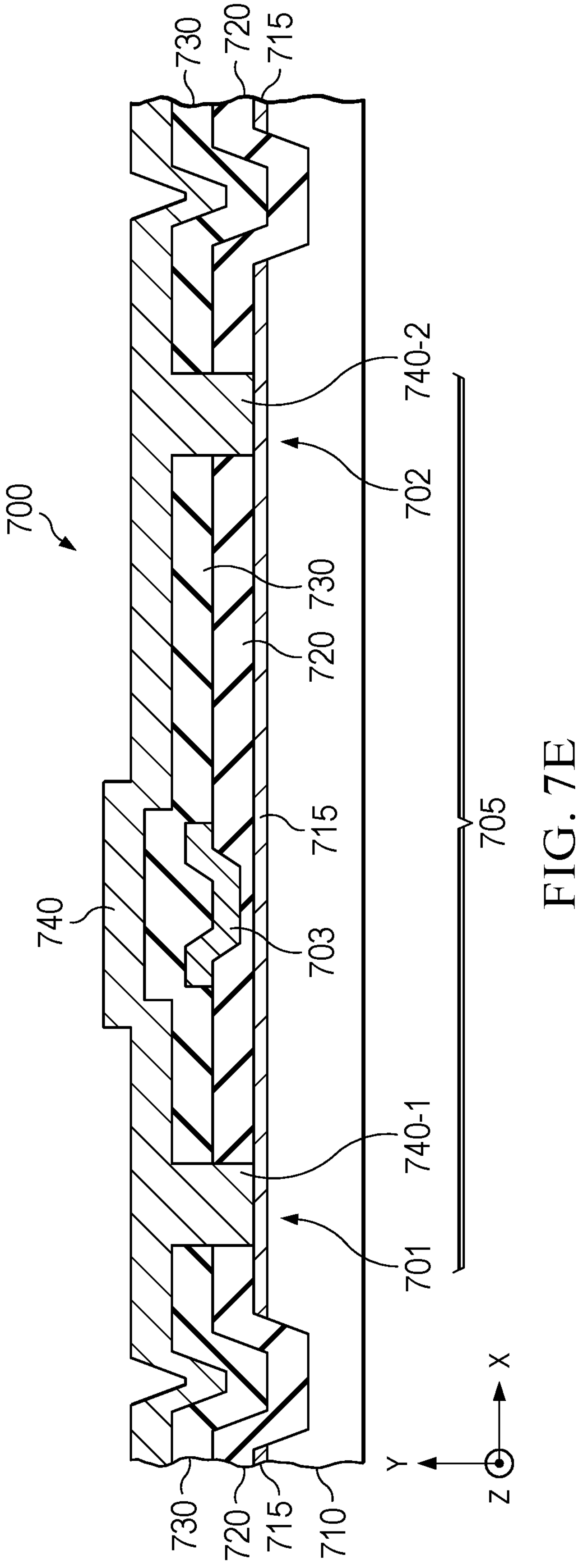

FIG. 7E illustrates the formation of layer 740 over layers 710, 720, and 730. As shown in FIG. 7E, layer 740 fills the voids created by the selective removal of layers 720 and 730, thereby forming vias 740-1 and 740-2. Via 740-1 extends through layers 720 and 730 in a direction parallel to the y-axis. A base of via 740-1 contacts a surface area of layer 710 located over source 701. Via 740-2 extends through layers 720 and 730 in a direction parallel to the y-axis. A base of via 740-2 contacts a surface area of layer 710 located over drain 702.

Figure 7F:
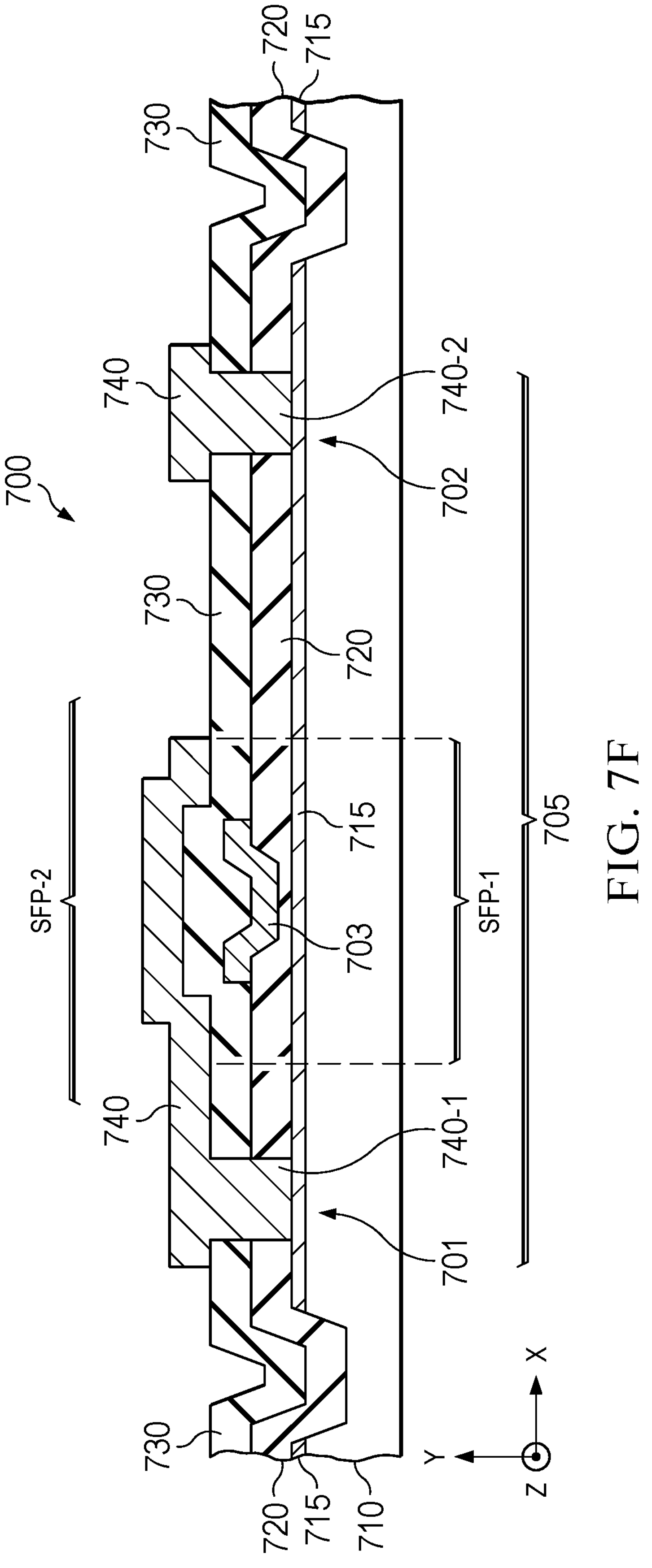

FIG. 7F illustrates the result of a selective removal of portions of layer 740. The selective removal of portions of layer 740 may be effected, for example, through pattern, etch, and clean processes. At least one result of the selective removal of portions of layer 740 is defining the shape of a source field plate SFP-1 extending from via 740-1 over and past gate 703 in a direction parallel to the x-axis, thus forming a contiguous electrically conductive path from the source 701 to SFP-1, including any conductive barrier and/or liner layers that may be used to form the layer 740. This feature is expected to result in increased reliability of the transistor 705, as well as cost savings due to elimination of process steps that would otherwise be needed to separately form a via in lieu of the via 740-1. In addition, the selective removal of portions of layer 740 results in layer 740 not providing an electrical connection between SFP-2 and via 740-2.

Figure 7G:
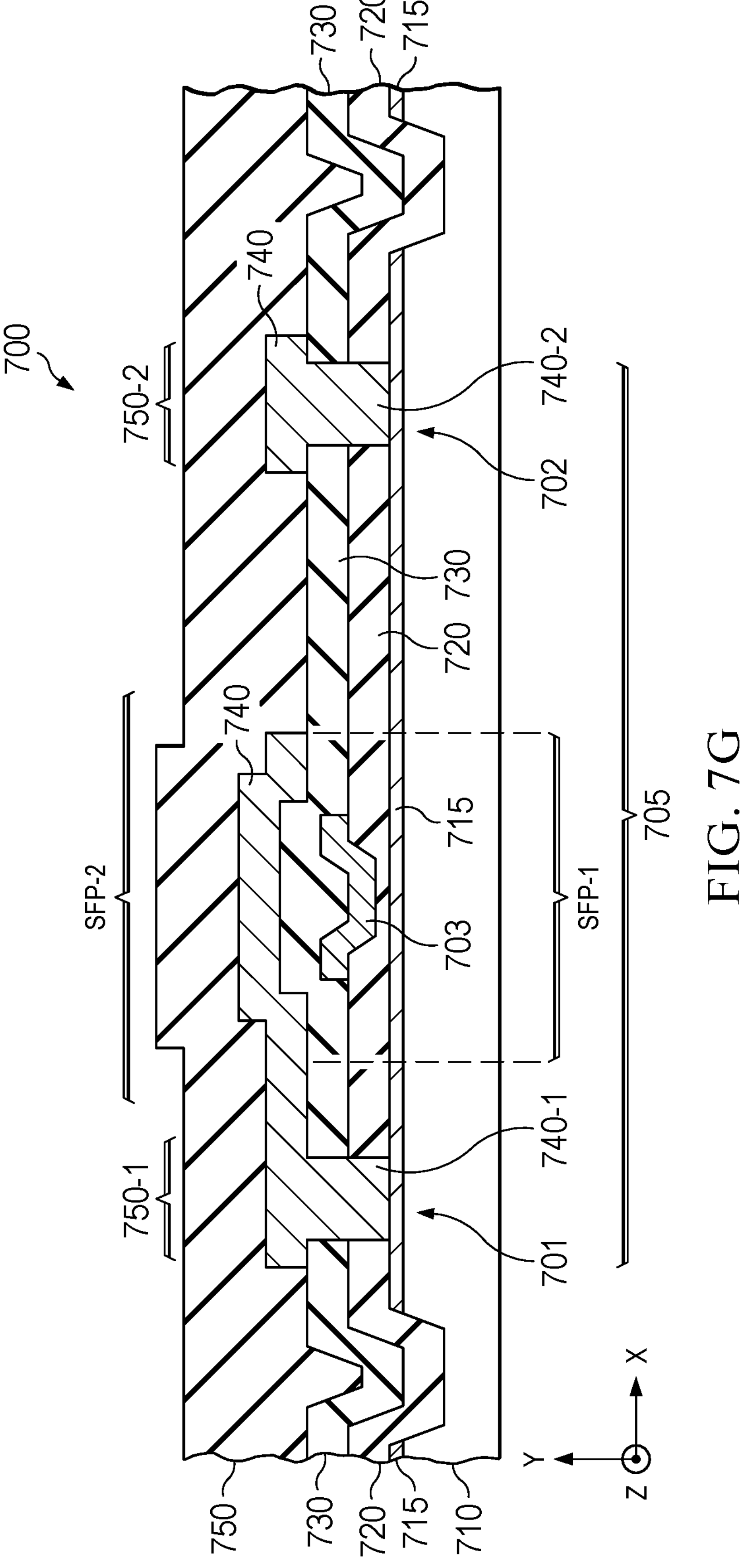

FIG. 7G illustrates the result of forming layer 750 over layers 730 and 740. As shown in FIG. 7G, a non-planar outermost surface of layer 7G conforms to a non-planar outermost surface of layer 740.

Figure 7H:
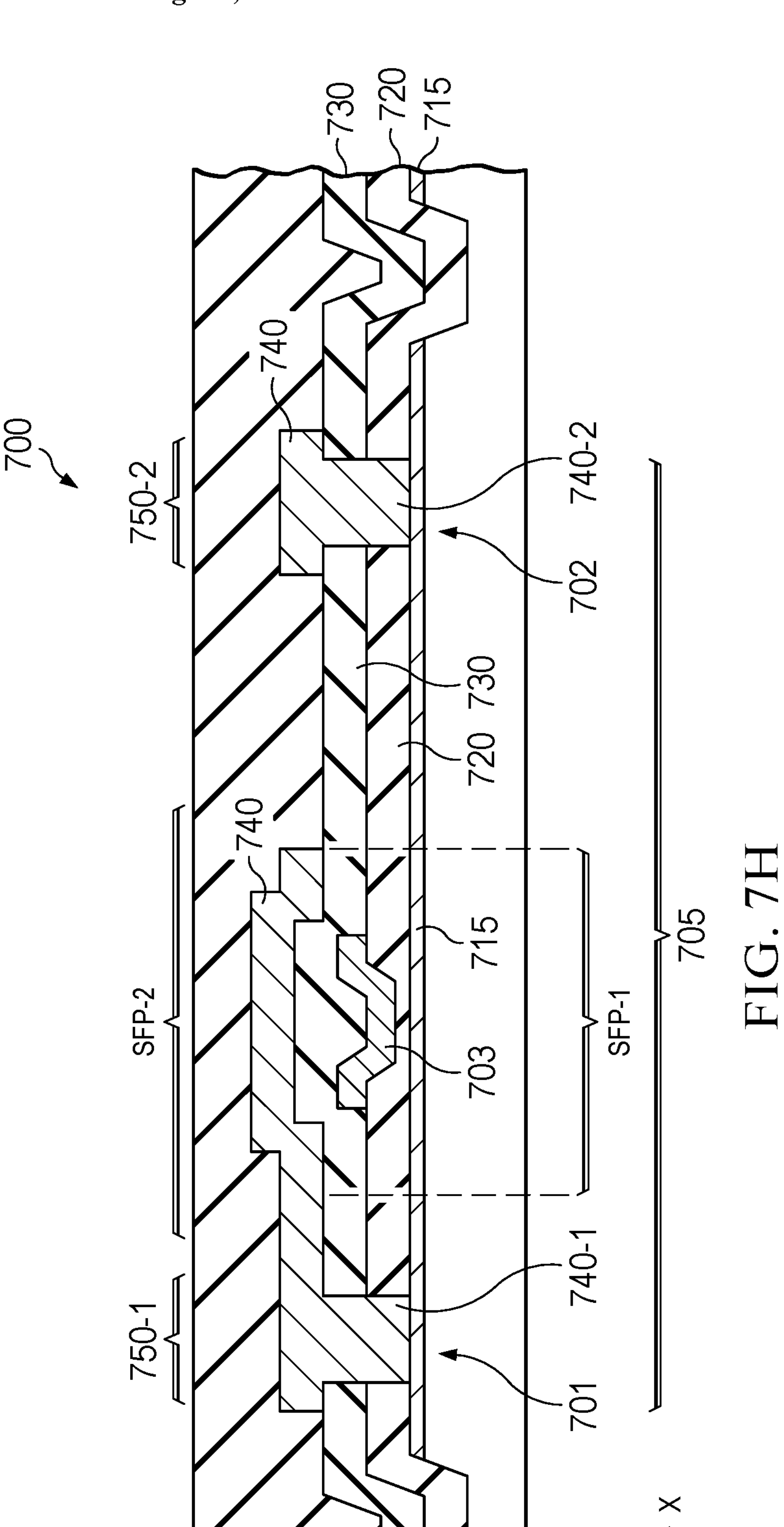

FIG. 7H illustrates the result of subjecting layer 750 to one or more planarization processes (e.g., CMP followed by a clean process). As shown in FIG. 7H, the planarizing processes results in layer 750 having a substantially planar outward-facing surface.

Figure 7I:
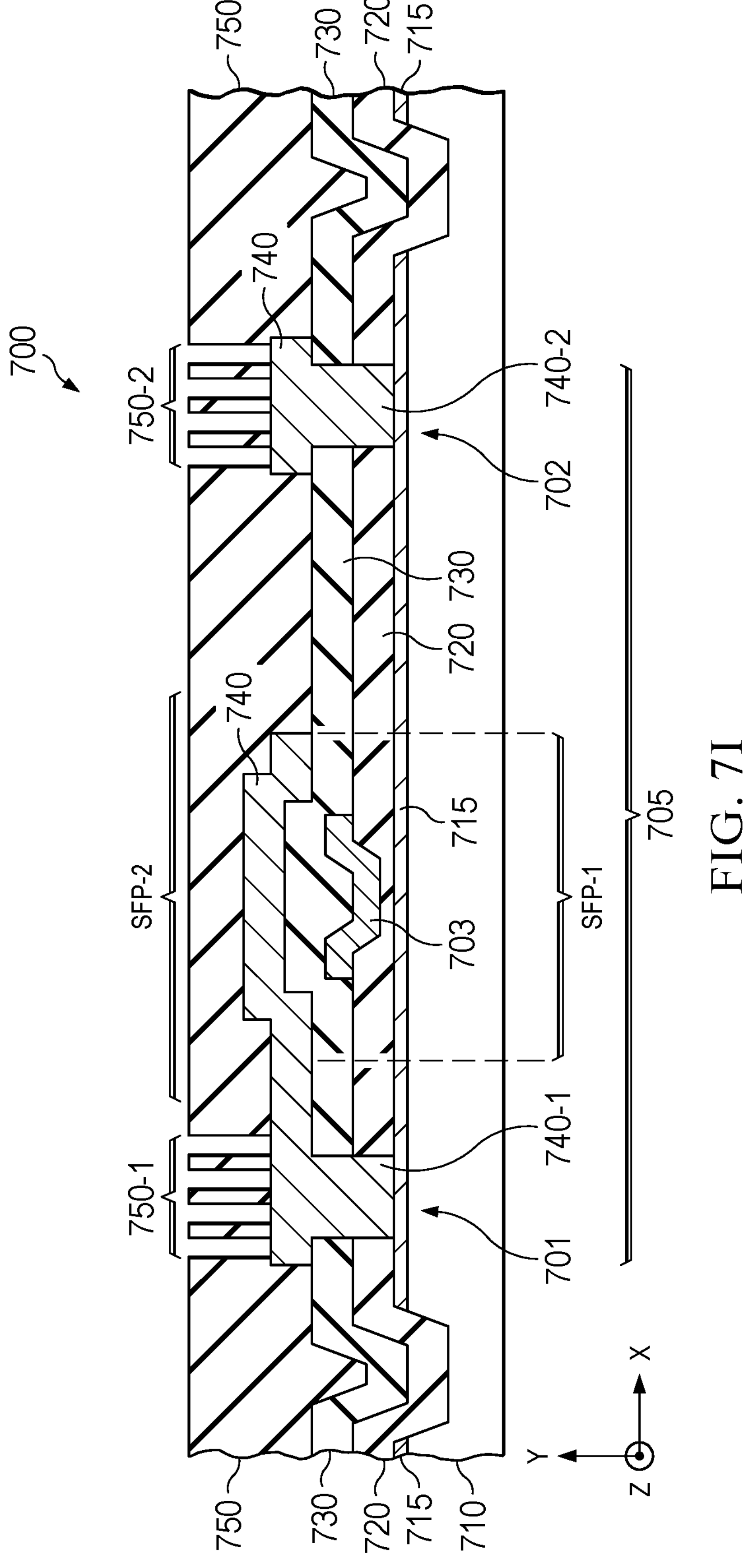

FIG. 7I shows the result of selectively removing portions of layer 750 thereof (e.g., through pattern, etch, and clean processes). The selective removal of layer 750 creates a first set of voids 750-1 over source 701 and via 740-1 and a second set of voids 750-2 over drain 702 and via 740-2. The first set of voids 750-1 each expose a corresponding surface of layer 740 located over via 740-1 and source 701. The second set of voids 750-2 each expose a corresponding surface of layer 740 located over via 750-2 and drain 702. The first set of voids 750-1 and the second set of voids 750-2 each extend completely through layer 750 in directions parallel to the y-axis.

Figure 7J:
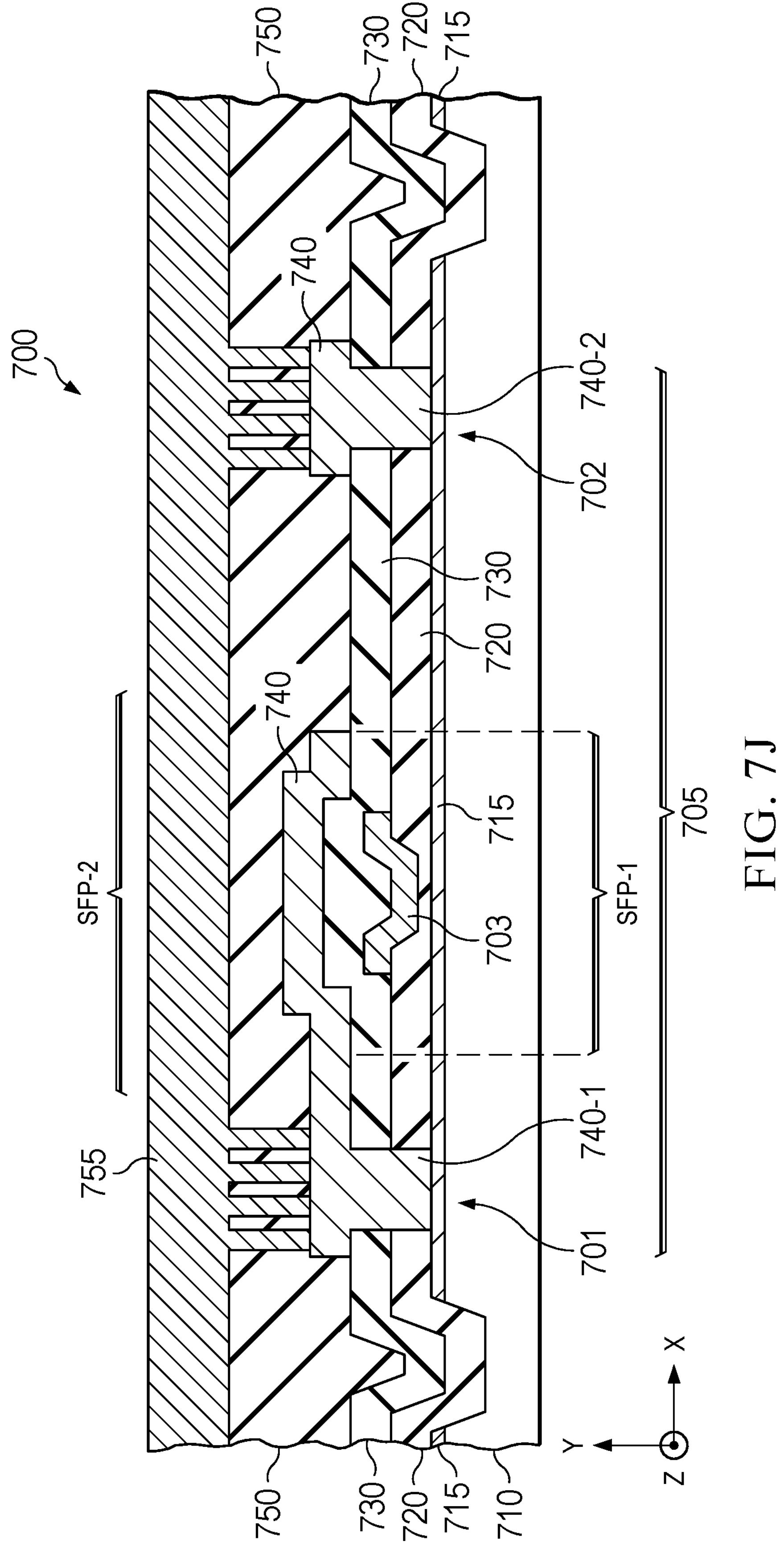

FIG. 7J illustrates the result of a forming a conductive layer 755 (e.g., through sputter deposition processing) over layers 740 and 750 in a manner that forms at least a first set of vias 755-1 and a second set of vias 755-2. In this example, conductive layer 755 includes tungsten; however, any suitable conductive material(s) may be used.

Use of set of narrower-width vias, as opposed to one wider via, may provide certain technical advantages in some applications. For example, while it may be desirable to shrink certain ICs in size, it may become increasing difficult to fully fill voids with conductive material when fabricating electrically-conductive vias. The use of a set of vias, each having narrower width relative to a single-via design, may facilitate filling certain voids when forming vias.

As shown in FIG. 7J, vias 755-1 each extend through layer 750 in a direction parallel to the y-axis. Each respective base of vias 755-1 contacts a surface area of layer 740 located over via 740-1 and source 701, such that vias 755-1 collectively form parallel electrically-conductive paths to layer 740, which provides an electrically-conductive path to layer 710. Vias 755-2 each extend through layer 750 in a direction parallel to the y-axis. Each respective base of vias 755-2 contacts a surface area of layer 740 that is positioned over via 740-2 and drain 702, such that vias 755-2 collectively form parallel electrically-conductive paths to layer 740, which provides an electrically-conductive path to layer 710.

Figure 7K:
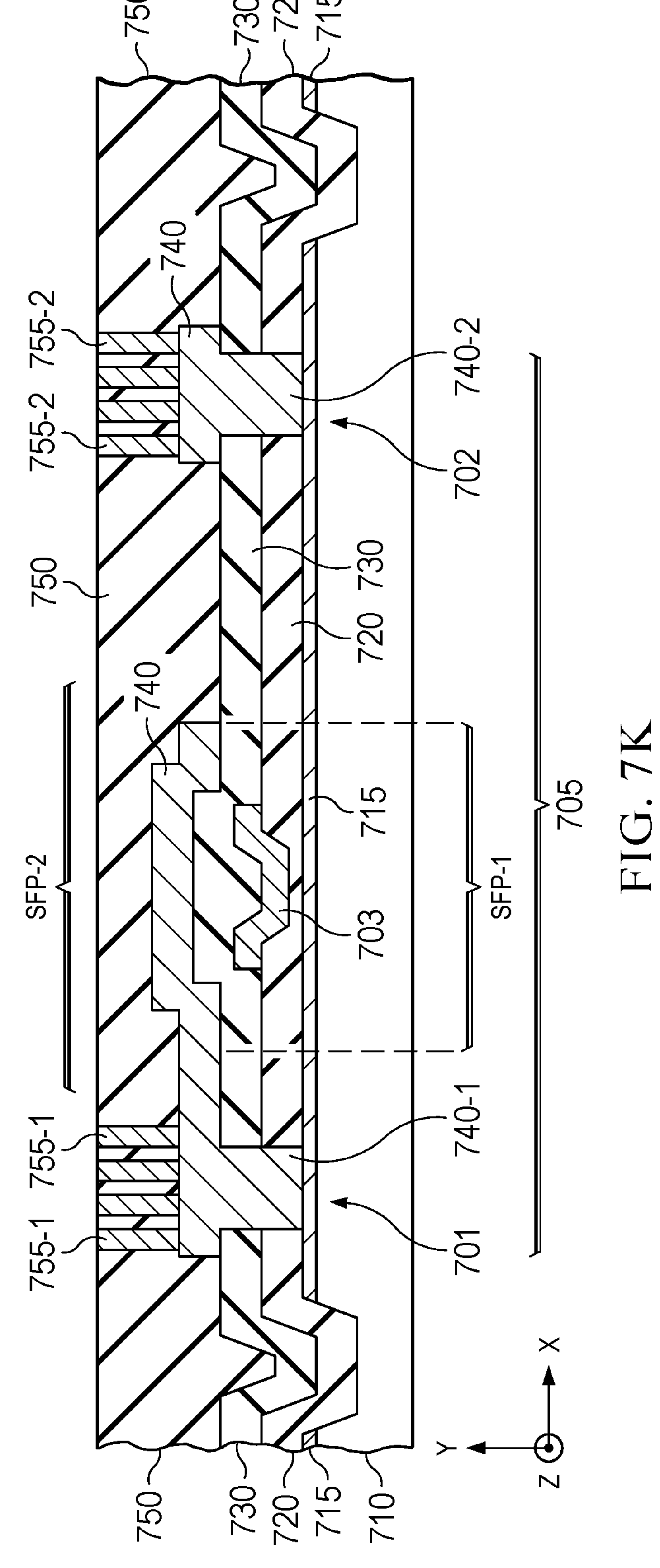

As shown in FIG. 7J, the deposition of layer 755 may result in layer 755 overfilling vias 755-1 and 755-2. To remove excess conductive material, layer 755 may be further subjected to planarization processing (e.g., CMP) and clean processing, for example. Such additional processing may result in layer 755 and layer 750 having substantially coplanar outermost surfaces, as shown in FIG. 7K.

Figure 7L:
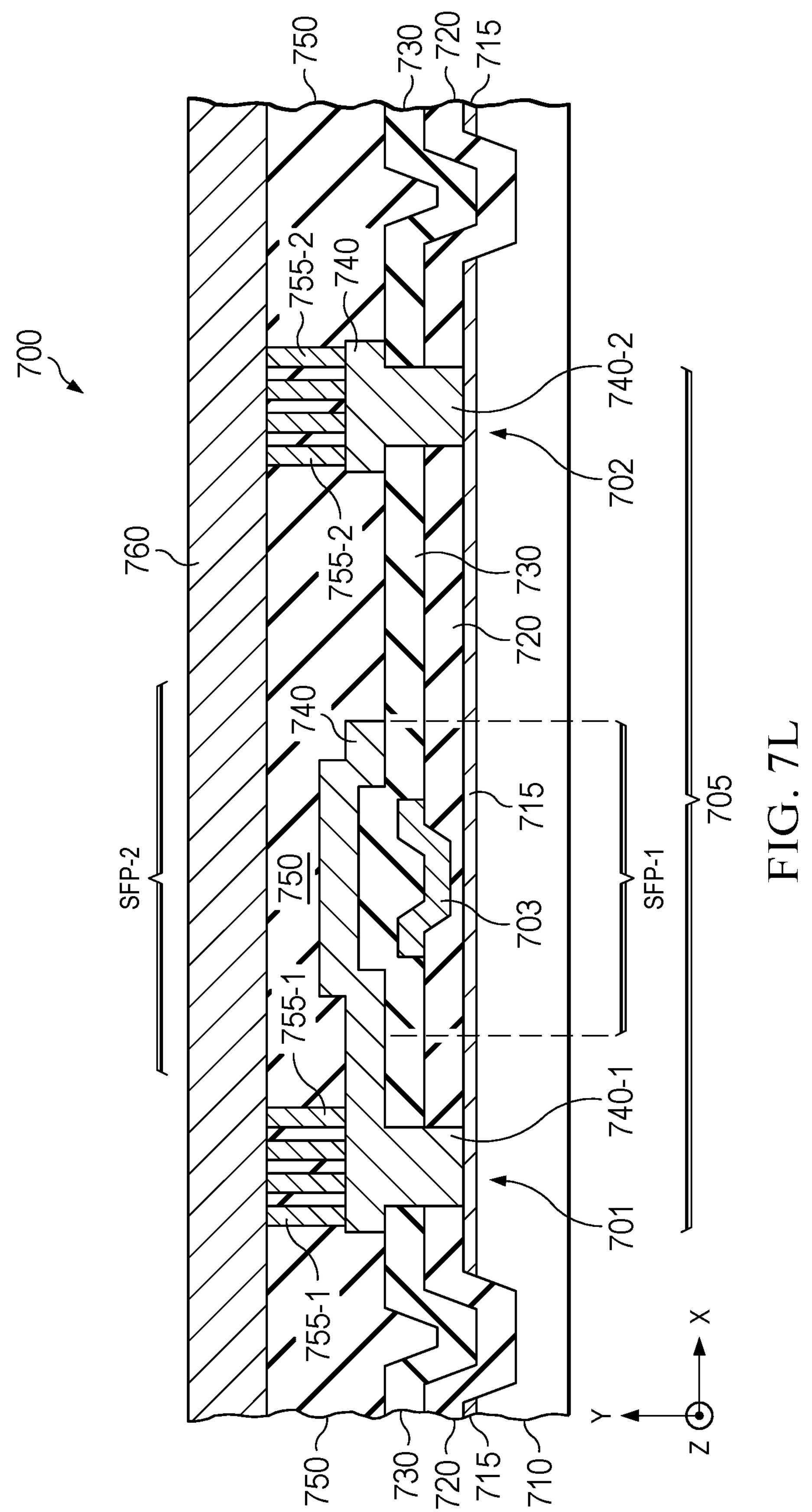

FIG. 7L illustrates the result of forming layer 760 over layers 750 and 755 (e.g., through sputter deposition processing).

Figure 7M:
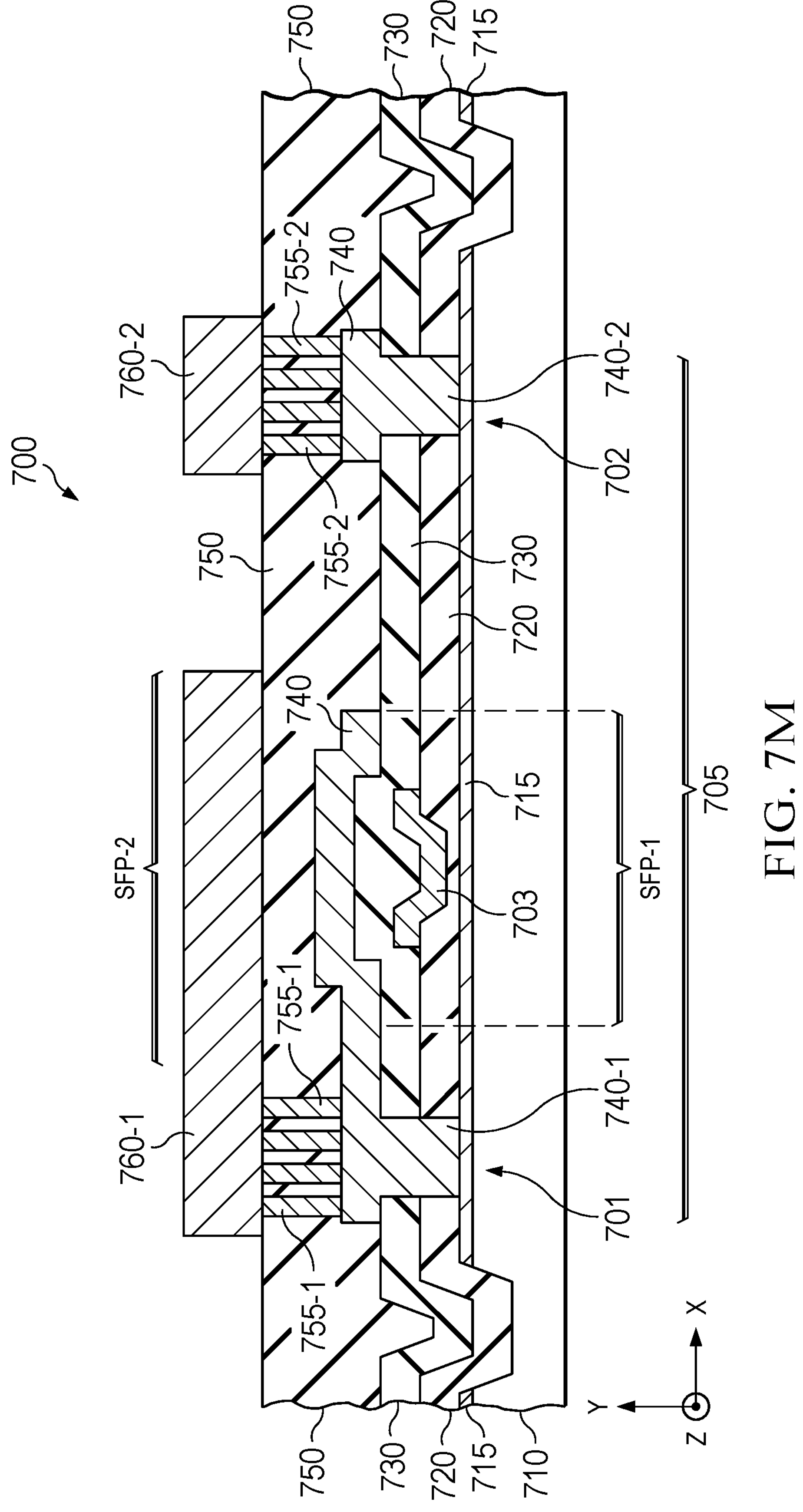

FIG. 7M illustrates the result of selectively removing portions of layer 760. At least one result of the selective removal of portions of layer 740 is defining the shape of a second source field plate SFP-2 extending from the first set of vias 755-1 over and past gate 703 in a direction parallel to the x-axis. In addition, at least one other result of the selective removal of portions of layer 740 is defining the shape of a contact 760-1 located over vias 755-2, via 740-2, and drain 702.

In certain examples, analogous processing used to form vias 755-1, vias 755-2, SFP-2, and contact 760-1 may be repeated outwardly, over what is shown in FIG. 7M, to form at least a third source field plate over SFP-2. FIG. 4 illustrates one such example configuration including a stack of three source field plates SFP-1, SFP-2, and SFP-3. In an alternative example, analogous processing used to form vias 755-1, vias 755-2 and contact 760-1 may be repeated outwardly, over what is shown in FIG. 7M, to provide electrical interconnects to contacts, such as the contacts shown in layer 580 of FIG. 5. Another alternative example may use a metal layer to form contacts interconnecting an inward metal layer having source field plate to an outward metal layer having another source field plate, such as the example shown in FIG. 6, in which layer 660 provides part of an electrically-conductive path that interconnects portions of layer 680 to corresponding portions of layer 640.

Figure 8:
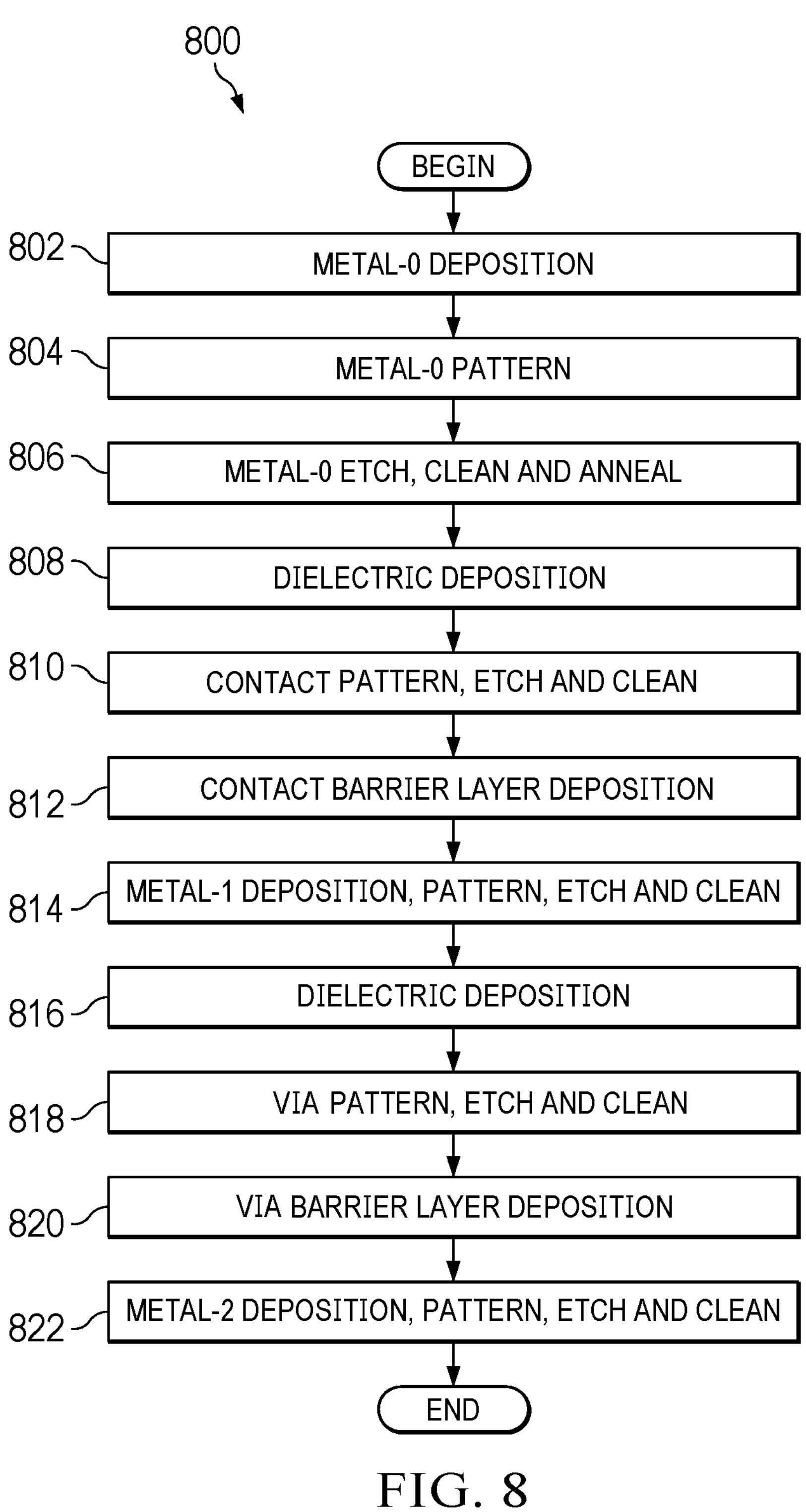
FIG. 8 is a flowchart illustrating a portion of a process for forming an IC including a stack of two or more metal field plates over at least a portion of a transistor according to one example.

FIG. 8 is a flowchart 800 illustrating a portion of a process for forming an IC including a stack of two or more metal field plates over at least a portion of a transistor according to one example. Flowchart 800 may be used, for example, in forming IC 100, 200, or 300 described herein with reference to FIGS. 1, 2 and 3, respectively.

Step 802 includes deposition of a metal-0 layer. The metal-0 layer may correspond, for example, to layers 140, 240 or 340 of FIG. 1, 2 or 3, respectively.

Step 804 includes photolithographic patterning of the metal-0 layer according to desired features.

Step 806 includes etch, clean, and anneal processes performed on the metal-0 layer. Example features of metal-0 resulting from completion of step 806 are representatively shown by layers 140, 240 or 340 of FIG. 1, 2 or 3, respectively.

Step 808 includes deposition of one or more dielectric layers over metal-0. The dielectric layer(s) over metal-0 may correspond, for example, to layers 150, 250 and 350 of FIG. 1, 2 or 3, respectively.

Step 810 includes the selective removal of portions of the dielectric layer(s) deposited over metal-0. The selective removal may include, for example, photolithographic patterning of the dielectric layer(s) deposited in step 808 with a contact pattern that facilitates the subsequent exposure of contact surfaces of metal-0. The selective removal of portions of the dielectric layer(s) deposited over metal-0 may further include, for example, etch and clean processes performed on the patterned dielectric layer(s).

The selective removal at step 810 performed on one or more dielectric layers over metal-0 may expose at least a first contact surface area and a second contact surface area of metal-0. The first exposed contact surface area of metal-0 is located over a first via of metal-0 (e.g., via 140-1, 240-1, or 340-1) and over the source of a transistor (e.g., source 101, 201, or 301). The second exposed contact surface area of metal-0 is located over a second via of metal-0 (e.g., vias 140-2, 240-2, or 340-2) and over the drain of a transistor (e.g., drain 102, 202, or 302).

Step 812 includes the deposition of a contact barrier layer. The contact barrier layer may be a thin layer of electrically-conductive material (e.g., titanium or titanium nitride) deposited on the dielectric layer(s) deposited in step 808 and selectively removed at step 810. The contact barrier layer may be deposited with a sufficient thickness to fully cover the outward-facing surfaces of the voids formed within the dielectric layer(s) as a result of performing step 810.

Deposition of a contact barrier layer (at step 812) may facilitate subsequent via fill processes (at step 814) by providing a conductive layer as a base upon which via fill processing is performed. The formation of a contact barrier layer may improve reliability in certain applications. For example, formation of a contact barrier layer as a base layer upon which interconnecting vias are subsequently formed may reduce the risk of filled vias popping out of place. The contact barrier layer may also be arranged to form electrical interconnections to inward layers or features, such as, for example, a gate of a transistor.

Step 814 includes the deposition of a metal-1 layer, followed by the photolithographic patterning, etch and clean of the deposited metal-1 layer. The etch and clean processes may also etch portions of the contact barrier layer deposited in step 810. The metal-1 layer is deposited over the dielectric layer(s) etched and cleaned in step 812 and over the contact barrier layer deposited in step 810 and selectively removed in step 812. The metal-1 layer is deposited with sufficient thickness to form conductive vias that fill the remainder of the voids within the dielectric layer resulting from the selective etch and clean performed in step 808. Example features of metal-1 resulting from completion of step 814 are representatively shown by layers 160, 260 and 360 and by vias 160-1, 160-2, 260-1, 260-1, 360-1 and 360-2 of corresponding FIG. 1, 2 or 3.

Step 816 includes deposition of one or more dielectric layers over metal-1 and over the exposed portions of the dielectric layer(s) processed in step 808. The dielectric layer(s) deposited at step 816 may correspond, for example, to layers 170, 270 or 370 of FIG. 1, 2 or 3, respectively.

Step 818 includes selective removal of portions of the dielectric layer(s) deposited in step 816. The selective removal may use a photolithographic pattern for a via that facilitates the subsequent exposure of contact surfaces of metal-1. The selective removal may further include etch and clean processes following expose based on the photolithographic pattern. Completion of the selective removal may result in exposing at least a first contact surface area and a second contact surface area of metal-1. The first exposed contact surface area of metal-1 is located over a first via of metal-1 (e.g., via 160-1, 260-1, or 360-1), a first via of metal-0 (e.g., via 140-1, 240-1, or 340-1) and over the source of a transistor (e.g., source 101, 201, or 301). The second exposed contact surface area of metal-1 is located over a second via of metal-1 (e.g., via 160-2, 260-2, or 360-2), a second via of metal-0 (e.g., vias 140-2, 240-2, or 340-2) and over the drain of a transistor (e.g., drain 102, 202, or 302).

Step 820 includes the deposition of a via barrier layer. The via barrier layer may be a thin layer of electrically-conductive material (e.g., titanium or titanium nitride) deposited on the dielectric layer(s) deposited at step 816 and selectively removed at step 818. The via barrier layer may be deposited with a sufficient thickness to fully cover the outward-facing surfaces of the voids formed within the dielectric layer(s) as a result of performing step 818.

Deposition of a via barrier layer (at step 820) may facilitate subsequent via fill processes by providing a conductive layer as a base upon which via fill processing is performed.

Step 822 includes the deposition of a metal-2 layer, followed by the photolithographic patterning, etch and clean of at least the deposited metal-2 layer, and optionally also the via barrier layer 820. The metal-2 layer is deposited over the dielectric layer(s) etched and cleaned in step 818 and over the via barrier layer deposited in step 820. Example features of metal-2 resulting from completion of step 822 are representatively shown by layers 180, 280 or 380 of FIG. 1, 2 or 3, respectively.

Figure 9:
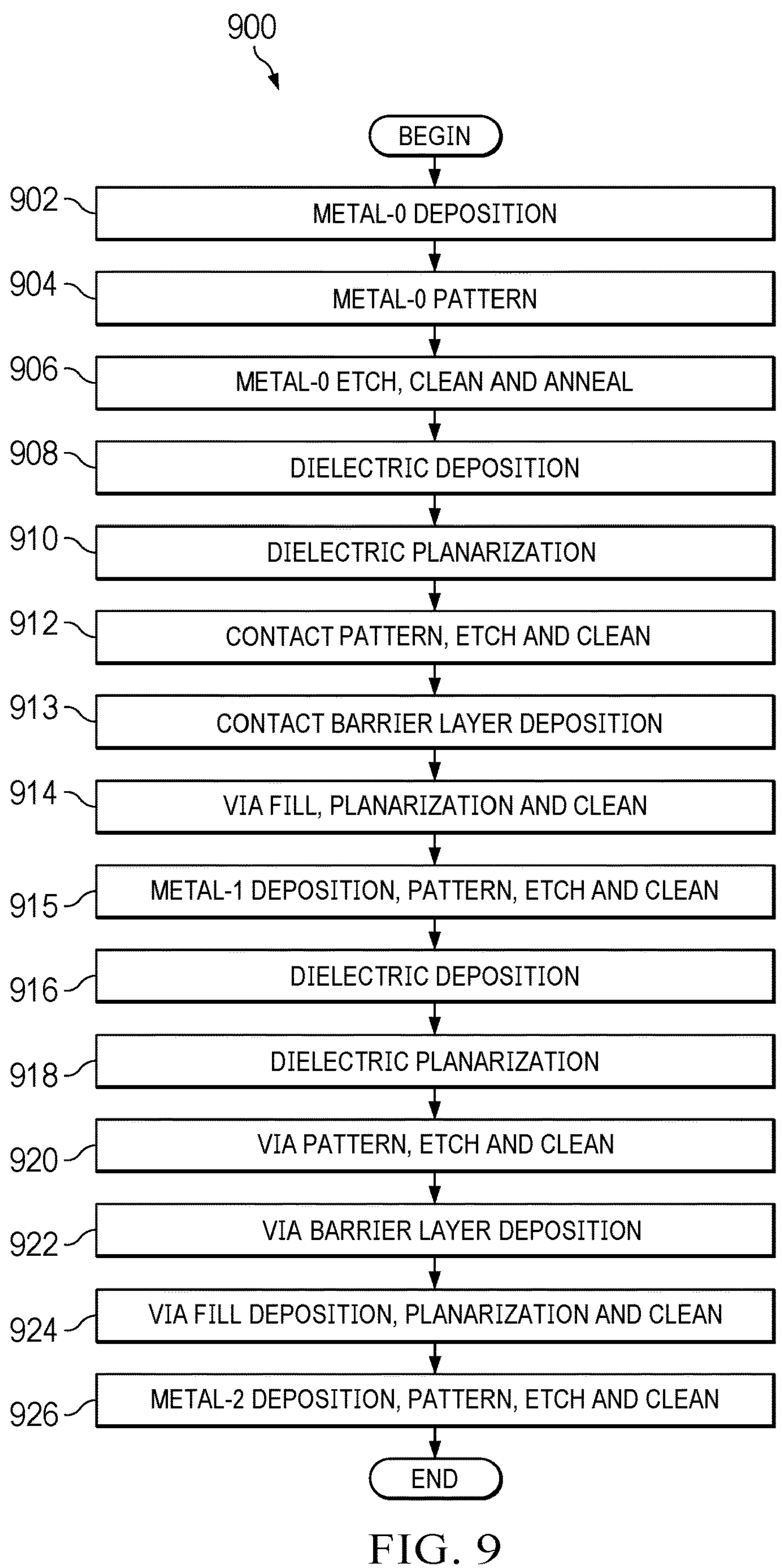
FIG. 9 is a flowchart illustrating a portion of a process for forming an IC including a stack of two or more metal field plates over at least a portion of a transistor according to an alternative example.

FIG. 9 is a flowchart 900 illustrating a portion of a process for forming an IC including a stack of two or more metal field plates over at least a portion of a transistor according to an alternative example. Flowchart 900 may be used, for example, in forming IC 400, 500, 600, or 700 described herein with reference to FIG. 4, 5, 6 or 7A-7M respectively.

Step 902 includes deposition of a metal-0 layer. The metal-0 layer may correspond, for example, to layers 440, 540, 640, or 740 of FIG. 4, 5, 6, or 7E-7M respectively.

Step 904 includes photolithographic patterning of the metal-0 layer according to desired features.

Step 906 includes etch, clean, and anneal processes performed on the metal-0 layer. Example features of metal-0 resulting from completion of step 906 are representatively shown by layers 440, 540, 640, or 740 of FIG. 4, 5, 6, or 7F-7M, respectively.

Step 908 includes deposition of one or more dielectric layers over metal-0. The dielectric layer(s) over metal-0 may correspond, for example, to layers 450, 550, 650 and 750 of FIG. 4, 5, 6 or 7G-7M, respectively.

Step 910 includes one or more planarizing processes (e.g., CMP and clean) that results in planarizing an outward-facing surface of the outermost dielectric layer deposited over metal-0 in step 908.

Step 912 includes the selective removal of portions of the one or more dielectric layers deposited over metal-0 in step 908 and planarized in step 910. The selective removal of one or more dielectric layers, performed at step 910, may include photolithographic patterning of the dielectric layer(s) deposited in step 908 with a contact pattern that facilitates the subsequent exposure of contact surfaces of metal-0. The selective removal may further include etch and clean processes performed on the patterned dielectric layer(s).

Completion of the etch and clean processes of step 912 result in selectively removing columns of the dielectric layer(s) deposited in step 908, and planarized in step 910, in a manner that exposes at least a first set of contact surface areas of metal-0 and a second set of contact surface areas of metal-0. The first set of exposed contact surface areas of metal-0 are located over a first via of metal-0 (e.g., via 440-1, 540-1, 640-1 or 740-1) and over the source of a transistor (e.g., source 401, 501, 601 or 701). The second set of exposed contact surface areas of metal-0 are located over a second via of metal-0 (e.g., vias 440-2, 540-2, 640-2 or 740-2) and over the drain of a transistor (e.g., drain 402, 502, 602 or 702).

Step 913 includes the deposition of a contact barrier layer. The contact barrier layer may be a thin layer of electrically-conductive material (e.g., titanium or titanium nitride) deposited on the dielectric layer(s) deposited at step 908 and selective removed eat step 912. The contact barrier layer may be deposited with a sufficient thickness to fully cover the outward-facing surfaces of the voids formed within the dielectric layer(s) as a result of performing step 910.

Deposition of a contact barrier layer (at step 913) may facilitate subsequent via fill processes (at step 914) by providing a conductive layer as a base upon which via fill processing is performed. The formation of a contact barrier layer may improve reliability in certain applications. For example, formation of a contact barrier layer as a base layer upon which interconnecting vias are subsequently formed may reduce the risk of filled vias popping out of place. The contact barrier layer may also be arranged to form electrical interconnections to inward layers or features, such as, for example, a gate of a transistor.

Step 914 includes deposition of an electrically-conductive layer (e.g., tungsten), over the contact barrier layer deposited in step 913, and in a manner that at least fills the remainder of the voids resulting from the pattern, etch, and clean processes performed (at step 912) on one or more dielectric layers. The complete filling of the voids creates a first set of vias (e.g., vias 455-1, 555-1, 655-1 or 755-1) and a second set of vias (e.g., vias 455-2, 555-2, 655-2 or 755-2).

The deposition of a conductive layer at step 914 may result in the deposited conductive layer overfilling the vias, as shown in FIG. 7J. To remove excess conductive material, the conductive layer deposited in step 914 may be further subjected to planarization processing (e.g., CMP) and clean processing, for example. Such additional processing may result in the outermost surface of the conductive layer deposited in step 914 being coplanar with an outermost surface of the dielectric layer(s) patterned, etched, and cleaned in step 910, as shown in FIG. 7K.

Step 915 includes the deposition of a metal-1 layer, followed by the photolithographic patterning, etch and clean of the deposited metal-1 layer. As shown in FIG. 7L, the metal-1 layer is deposited over the planarized outermost surfaces of the underlying dielectric layer(s) formed in steps 908-910 and the via fill layer(s) formed in step 914.

Step 915 further includes the selective removal of portions of the deposited metal-1 layer (e.g., by photolithographic patterning, etch, and clean processes). Example features of metal-1 resulting from completion the selective removal of the deposited metal-1 layer are representatively shown by layers 460, 560 660, or 760 of FIG. 4, 5 6 or 7M, respectively.

Step 916 includes deposition of one or more dielectric layers over metal-1 and over the exposed portions of the dielectric layer(s) processed in steps in 908-910. The dielectric layer(s) deposited at step 916 may correspond, for example, to layers 470, 570 or 670 of FIG. 4, 5 or 6, respectively.

Step 918 includes one or more planarizing processes (e.g., CMP) that results in planarizing an outward-facing surface of the outermost dielectric layer deposited at step 916.

Step 920 includes photolithographic patterning of the dielectric layer(s) planarized in step 918 with a pattern that facilitates the subsequent exposure of contact surfaces of metal-1. Step 920 further includes etch and clean processes performed on the dielectric layer(s) patterned in step 920. Completion of the etch and clean processes of step 920 result in selectively removing columns of the dielectric layer(s) patterned in step 920 in a manner that exposes at least a first set of contact surface areas of metal-1 and a second set of contact surface areas of metal-1. The first set of exposed contact surface areas of metal-1 are located over a first set of vias (e.g., vias 455-1, 555-1, 655-1, or 755-1), a first via of metal-0 (e.g., via 440-1, 540-1, 640-1 or 740-1) and over the source of a transistor (e.g., source 401, 501, 601 or 701). The second set of exposed contact surface areas of metal-1 are located over a second set of vias (e.g., vias 455-2, 555-2, 655-2, or 755-2), second via of metal-0 (e.g., vias 440-2, 540-2, 640-2 or 750-2) and over the drain of a transistor (e.g., drain 402, 502, 602 or 702).

Step 922 includes deposition of a via barrier layer. For example, the via barrier layer may be a thin layer of electrically-conductive material (e.g., titanium or titanium nitride). Deposition of a via barrier layer may facilitate subsequent via fill processes (at step 924) by providing a conductive layer as a base upon which via fill processing is performed. Use of a via barrier layer may improve reliability in certain applications. For example, a barrier layer as a base layer upon which interconnecting vias are subsequently formed may reduce the risk of filled vias popping out of place.

Step 924 includes deposition of an electrically-conductive layer (e.g., tungsten), over the via barrier layer deposited in step 922, and in a manner that at least fills the remainder of the voids resulting from the pattern, etch, and clean processes performed (at step 920) on one or more dielectric layers. The complete filling of the voids creates a first set of vias (e.g., vias 475-1, 575-1, 675-1 or 775-1) and a second set of vias (e.g., vias 475-2, 575-2, 675-2 or 775-2). Similar to what is shown in FIG. 7J, the deposition of a conductive layer at step 924 may result in the deposited conductive layer overfilling the vias. To remove excess conductive material, the conductive layer deposited in step 924 may be further subjected to planarization processing (e.g., CMP) and clean processing, for example. Such additional processing may result in the outermost surface of the conductive layer deposited in step 924 being coplanar with an outermost surface of the dielectric layer(s) patterned, etched, and cleaned in step 920.

Step 926 includes the deposition of a metal-2 layer, followed by the photolithographic patterning, etch and clean of the deposited metal-2 layer. The metal-2 layer is deposited over the planarized dielectric layer(s) etched and cleaned in step 920 and over the conductive layer deposited and planarized in step 924. Example features of metal-2 resulting from completion of step 926 are representatively shown by layers 480, 580 or 680 of FIG. 4, 5 or 6 respectively.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context. To aid the Patent Office, and any readers of any patent issued on this application, in interpreting the claims appended hereto, applicant notes that there is no intention that any of the appended claims invoke paragraph 6 of 35 U.S.C. § 112 as it exists on the date of filing hereof unless the words "means for" or "step for" are explicitly used in the claim language.

In the foregoing descriptions, for purposes of explanation, numerous specific details are set forth to provide a thorough understanding of one or more examples. However, this disclosure may be practiced without some or all these specific details, as will be evident to one having ordinary skill in the art. In other instances, well-known process steps or structures have not been described in detail in order not to unnecessarily obscure this disclosure. In addition, while the disclosure is described in conjunction with example examples, this description is not intended to limit the disclosure to the described examples. To the contrary, the description is intended to cover alternatives, modifications, and equivalents as may be included within the spirit and scope of the disclosure as defined by the appended claims.

What is claimed is:

1. An integrated circuit, comprising:

a transistor having an insulator layer over a substrate that includes gallium nitride (GaN);

first and second openings in the insulator layer that respectively define a drain region and a source region of the transistor;

a gate electrode extending into the insulator layer between the source region and the drain region;

a metal layer that includes a drain via and a source via, the drain via extending through the first opening to the drain region, and the source via extending through the second opening to the source region; and a source field plate in the metal layer, the source field plate extending over the gate electrode and providing a contiguous electrically conductive path to the source region, wherein the metal layer is a first metal layer and the source field plate is a first source field plate, and further comprising a second source field plate in a second metal layer located over the first source field plate, and the first metal layer comprises a first metallic material, and further comprising a second via over the source via, the second via comprising a second metallic material different than the first metallic material.

2. The integrated circuit of claim 1, wherein the second metal layer includes a second via over the source via, the second via and the second source field plate contiguously connected.

3. The integrated circuit of claim 1, further comprising an insulator layer between the first and second metal layers, the insulator layer having a substantially planar surface in contact with the second metal layer.

4. The integrated circuit of claim 1, further comprising a silicon nitride layer between the first and second metal layers.

5. The transistor of claim 1, wherein the insulator layer is a first insulator layer, and further comprising a second insulator layer between the first and second metal layers, the second metal layer located on a planar top surface of the second insulator layer.

6. The transistor of claim 1, further comprising:

a third metal layer between the first and second metal layers; and a second insulator layer between the first and third metal layers, the second insulator layer having a planarized surface in contact with the third metal layer.

7. A transistor, comprising:

an insulator layer over a substrate including a semiconductor layer comprising aluminum, gallium and nitrogen;

a first opening extending through the insulator layer and into the semiconductor layer defining a drain region;

a second opening extending through the insulator layer and into the semiconductor layer defining a source region;

a gate electrode extending into the insulator layer between the source region and the drain region; and a metal layer including noncontiguous first and second portions, the first portion extending into the first opening and touching the semiconductor layer and the second portion extending from the semiconductor layer over the gate electrode to form a source field plate, wherein the metal layer is a first metal layer the source field plate is a first source field plate, and further comprising:

a second metal layer over the first metal layer, the second metal layer including noncontiguous third and fourth portions, the third portion conductively connected to the first portion of the first metal layer and the fourth portion conductively connected to the second portion of the first metal layer, the fourth portion having a second source field plate over the first source field plate.

8. The transistor of claim 7, wherein the insulator layer is a first insulator layer, and further comprising a second insulator layer between the first and second metal layers, the second metal layer located on a planar top surface of the second insulator layer.

9. The transistor of claim 7, wherein the fourth portion of the second metal layer touches the second portion of the first metal layer.

10. The transistor of claim 7, wherein the insulator layer is a first insulator layer, and further comprising a second insulator layer between the first and second metal layers, wherein the fourth portion of the second metal layer is conductively connected to the second portion of the first metal layer by a via through the second insulator layer, the via and the second metal layer comprising different metallic materials.

11. The transistor of claim 7, further comprising:

a third metal layer between the first and second metal layers; and a second insulator layer between the first and third metal layers, the second insulator layer having a planarized surface in contact with the third metal layer.

12. The transistor of claim 9, wherein the second metal layer comprises aluminum and the via comprises tungsten.

13. A method comprising:

forming a first opening extending through a first insulating layer to a substrate including gallium nitride (GaN), the first opening defining a drain of a transistor;

forming a second opening extending through the first insulating layer to the substrate, the second opening defining a source the transistor forming a gate of the transistor extending into the first insulating layer;

forming a first metal layer over the first insulating layer, the first metal layer having:

a first via extending through the first opening to the substrate;

a second via extending through the second opening to the substrate; and a first source field plate over the gate, the first source field plate and the second via being contiguous portions of the first metal layer, forming a second metal layer over the first metal layer, the second metal layer having a second source field plate over the gate, wherein forming the second metal layer includes depositing the second metal layer on a planarized surface of an insulator layer; and forming a third metal layer over the second metal layer, the third metal layer having a third source field plate over the gate.

14. The method of claim 10, wherein forming the third metal layer includes depositing the third metal layer on a planarized surface of an insulator layer.

15. The method of claim 10, wherein forming the third metal layer includes depositing the third metal layer on a planarized surface area of a fourth metal layer, the fourth metal layer including a third via, the third via contacting a portion of the third metal layer at a first end of the third via and the third via contacting a portion of the second metal layer at a second end of the third via.

* * * * *